(12) United States Patent
Chang et al.

(10) Patent No.: US 12,255,267 B2
(45) Date of Patent: Mar. 18, 2025

(54) DISPLAY DEVICE AND METHOD OF FABRICATING DISPLAY DEVICE

(71) Applicant: Samsung Display Co., LTD., Yongin-si (KR)

(72) Inventors: Chong Sup Chang, Yongin-si (KR); Cha Dong Kim, Yongin-si (KR); Hee Na Kim, Yongin-si (KR); In Kyung Yoo, Yongin-si (KR); Sang Jin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 477 days.

(21) Appl. No.: 17/307,457

(22) Filed: May 4, 2021

(65) Prior Publication Data

US 2022/0085243 A1   Mar. 17, 2022

(30) Foreign Application Priority Data

Sep. 16, 2020   (KR) ........................ 10-2020-0119407

(51) Int. Cl.
| | |
|---|---|
| *H01L 33/38* | (2010.01) |
| *H01L 25/16* | (2023.01) |
| *H01L 27/12* | (2006.01) |
| *H01L 33/42* | (2010.01) |
| *H01L 33/62* | (2010.01) |

(52) U.S. Cl.
CPC ............ *H01L 33/38* (2013.01); *H01L 25/167* (2013.01); *H01L 27/1259* (2013.01); *H01L 33/62* (2013.01); *H01L 33/42* (2013.01); *H01L 2933/0016* (2013.01)

(58) Field of Classification Search
CPC ..... H01L 33/00–648; H01L 27/15–156; H01L 2933/00–0091
See application file for complete search history.

(56) References Cited

U.S. PATENT DOCUMENTS

| | | |
|---|---|---|
| 10,658,605 B2 | 5/2020 | Lee et al. |
| 2017/0200707 A1 | 7/2017 | Rogers et al. |

(Continued)

FOREIGN PATENT DOCUMENTS

| | | |
|---|---|---|
| EP | 3 582 270 | 12/2019 |
| KR | 10-2019-0029831 | 3/2019 |

(Continued)

*Primary Examiner* — Evren Seven
*Assistant Examiner* — Cole Leon Lindsey
(74) *Attorney, Agent, or Firm* — KILE PARK REED & HOUTTEMAN PLLC

(57) ABSTRACT

A display device includes a first electrode and a second electrode disposed on a substrate and spaced apart from each other in a first direction. A light emitting element is disposed between the first electrode and the second electrode. A third electrode is disposed on the first electrode and electrically contacts an end portion of the light emitting element. A fourth electrode is disposed on the second electrode and electrically contacts another end portion of the light emitting element. A side of the third electrode and a side of the first electrode are located on a first virtual line substantially perpendicular to the substrate. A side of the fourth electrode facing the side of the third electrode and the side of the second electrode are located on a second virtual line substantially perpendicular to the substrate.

16 Claims, 26 Drawing Sheets

(56) References Cited

U.S. PATENT DOCUMENTS

| | | | |
|---|---|---|---|
| 2018/0012876 A1* | 1/2018 | Kim | H01L 27/124 |
| 2019/0165318 A1* | 5/2019 | Choi | H10K 59/124 |
| 2020/0066699 A1 | 2/2020 | Kim et al. | |
| 2020/0144453 A1 | 5/2020 | Chang et al. | |
| 2021/0272938 A1 | 9/2021 | Chang et al. | |
| 2022/0130896 A1 | 4/2022 | Kim | |

FOREIGN PATENT DOCUMENTS

| | | |
|---|---|---|
| KR | 10-2020-0052512 | 5/2020 |
| KR | 10-2022-0053766 | 5/2022 |
| WO | 2020/017746 | 1/2020 |

* cited by examiner

DISPLAY DEVICE AND METHOD OF FABRICATING DISPLAY DEVICE

CROSS-REFERENCE TO RELATED APPLICATION(S)

This application claims priority to and benefits of Korean patent application 10-2020-0119407 under 35 U.S.C. § 119 filed on Sep. 16, 2020, in the Korean Intellectual Property Office, the entire contents of which are incorporated herein by reference.

BACKGROUND

1. Technical Field

The disclosure generally relates to a display device and a method of fabricating the same.

2. Description of the Related Art

As interest in information displays and demand for portable information media increase, research and commercialization has focused on display devices.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device formed through a fabricating process that decreases a number of masks, and a method of fabricating the display device.

In accordance with an aspect of the disclosure, there is provided a display device that may include a first electrode and a second electrode disposed on a substrate and spaced part from each other in a first direction; a light emitting element overlapping a side of the first electrode and a side of the second electrode in a thickness direction of the substrate between the first electrode and the second electrode; a third electrode disposed on the first electrode, the third electrode electrically contacting an end portion of the light emitting element; and a fourth electrode disposed on the second electrode, the fourth electrode electrically contacting another end portion of the light emitting element, the fourth electrode being spaced apart from the third electrode in the first direction, wherein a side of the third electrode and the side of the first electrode are located on a first virtual line substantially perpendicular to the substrate, and a side of the fourth electrode facing the side of the third electrode and the side of the second electrode are located on a second virtual line substantially perpendicular to the substrate.

A distance between the third electrode and the fourth electrode may be equal to a distance between the first electrode and the second electrode. The side of the third electrode may coincide with the side of the first electrode in a plan view, and the side of the fourth electrode may coincide with the side of the second electrode in a plan view.

A first distance between the side of the third electrode and the side of the first electrode may be equal to a second distance between the side of the fourth electrode and the side of the second electrode in a plan view. The first distance between the side of the third electrode and the side of the first electrode may be about 1 μm or less.

A distance between the third electrode and the fourth electrode may be less than a distance between the first electrode and the second electrode.

The first electrode and the second electrode may include an opaque conductive material, and the third electrode and the fourth electrode may include a transparent conductive material.

An opaque conductive material may not be disposed between the first electrode and the second electrode in a plan view, except the light emitting element.

The display device may further include a passivation layer disposed on the third electrode and the fourth electrode. The passivation layer may fill a gap between the first electrode and the second electrode, the gap being formed below the light emitting element.

The display device may further include a first insulating layer disposed between the first electrode and the second electrode and the light emitting element.

A width of the light emitting element in the thickness direction of the substrate may be less than a length of the light emitting element in the first direction.

The display device may further include an insulating pattern disposed on the light emitting element between the third electrode and the fourth electrode.

A first side surface of the insulating pattern may be located on the first virtual line, and a second side surface of the insulating pattern may be located on the second virtual line.

The insulating pattern may fill a gap between the first electrode and the second electrode, the gap being formed below the light emitting element.

The third electrode may contact the first side surface of the insulating pattern, and the fourth electrode may contact the second side surface of the insulating pattern. The third electrode and the fourth electrode may not contact a top surface of the insulating pattern.

The third electrode may overlap the first side surface of the insulating pattern, and the fourth electrode may overlap the second side surface of the insulating pattern.

A section of the insulating pattern along the first direction may have a substantially trapezoidal shape, and an area of a bottom surface of the insulating pattern may be greater than an area of a top surface of the insulating pattern.

A section of the insulating pattern along the first direction may have a reversed tapered shape, and an area of a bottom surface of the insulating pattern may be less than an area of a top surface of the insulating pattern.

In accordance with another aspect of the disclosure, there is provided a method of fabricating a display device, the method may include forming a first electrode and a second electrode on a substrate, the first electrode and the second electrode being spaced apart from each other in a first direction; aligning a light emitting element to overlap a side of the first electrode and a side of the second electrode, the first side and the second side face each other, in a thickness direction of the substrate between the first electrode and the second electrode; forming an electrode layer overlapping the first electrode, the second electrode, and the light emitting element; forming a photoresist on the electrode layer; irradiating light onto the photoresist through the substrate by using the first electrode and the second electrode as a mask; stripping the photoresist between the first electrode and the second electrode using a development process; forming a third electrode and a fourth electrode by removing a portion of the electrode layer exposed between the first electrode and the second electrode using an etching process; and stripping all of the photoresist.

The first electrode and the second electrode may include an opaque conductive material, and the third electrode and the fourth electrode may include a transparent conductive material.

An opaque conductive material may not be disposed between the first electrode and the second electrode in a plan view, except the light emitting element.

The forming of the electrode layer may include forming an insulating pattern on the light emitting element between the first electrode and the second electrode; and forming the electrode layer overlapping the insulating pattern.

The forming of the insulating pattern may include forming an organic insulating layer overlapping the first electrode, the second electrode, and the light emitting element; irradiating light onto the organic insulating layer through the substrate by using the first electrode and the second electrode as a mask; and removing the organic insulating layer overlapping the first electrode and the second electrode in a plan view, except the insulating pattern, using a development process.

The photoresist may include a positive type photoresist material, and the organic insulating layer may include a negative type photoresist material.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

The above and other aspects and features of the disclosure will become more apparent by describing in detail embodiments thereof with reference to the attached drawings, in which.

DETAILED DESCRIPTION OF THE EMBODIMENTS

Figure 1:
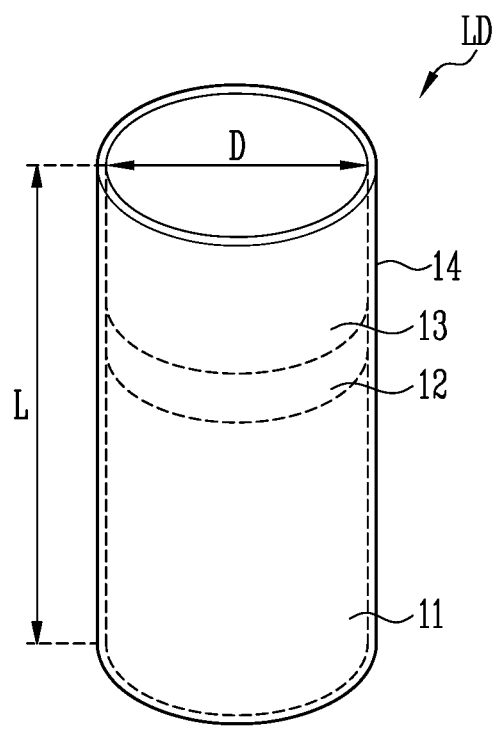
FIG. 1 is a perspective view schematically illustrating a light emitting element in accordance with an embodiment.

The disclosure may apply various changes and different forms, thus the disclosure and drawings illustrate details with examples. However, the examples are not limited to certain shapes but apply to all of the changes and equivalents. The drawings are included herein to facilitate a better understanding as would be appreciated and understood by one of ordinary skill in the art.

Like numbers refer to like elements throughout. In the drawings, the thickness of lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be understood that when an element is referred to as being "between" two elements, it can be the only element between the two elements, or one or more intervening elements may also be present.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprises" and/or "comprising", "includes" and/or "including", "has/have" and/or "having", and their variations when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments for those skilled in the art to understand the disclosure will be described in detail with reference to the accompanying drawings. In the following description, singular forms in the disclosure are intended to include the plural forms as well, unless the context clearly indicates otherwise.

Figure 2:
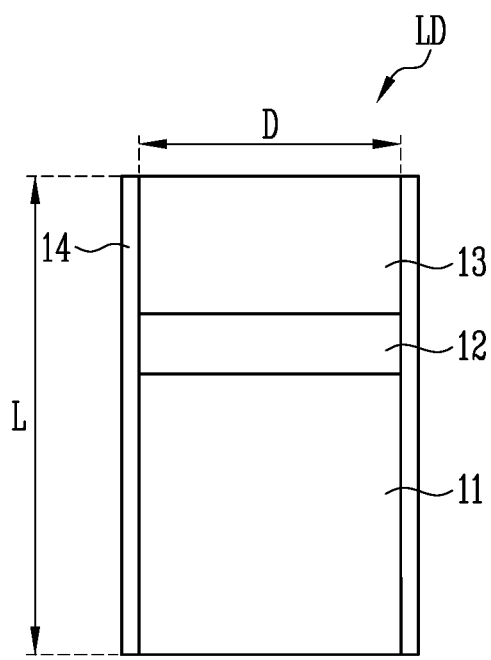
FIG. 2 is a schematic cross-sectional view of the light emitting element shown in FIG. 1.

FIG. 1 is a perspective view schematically illustrating a light emitting element in accordance with an embodiment. FIG. 2 is a schematic cross-sectional view of the light emitting element shown in FIG. 1.

In an embodiment, the type and/or shape of the light emitting element is not limited to the embodiments shown in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. In an example, the light emitting element LD may be implemented with a light emitting stack structure in which the first semiconductor layer 11, the active layer 12, and the second semiconductor layer 13 may be sequentially stacked each other.

The light emitting element LD may be provided in a shape substantially extending in one or a direction. In a case that assuming that an extending direction of the light emitting element LD is a length direction, the light emitting element LD may include one or an end portion (or lower end portion) and the other or another end portion (or upper end portion) along the extending direction. Any one of the first and second semiconductor layers 11 and 13 may be disposed at the one or an end portion (or lower end portion) of the light emitting element LD, and the other of the first and second semiconductor layers 11 and 13 may be disposed at the other or another end portion (or upper end portion) of the light emitting element LD. In an example, the first semiconductor layer 11 may be disposed at the one or an end portion (or lower end portion) of the light emitting element LD, and the second semiconductor layer 13 may be disposed at the other or another end portion (or upper end portion) of the light emitting element LD.

The light emitting element LD may be provided in various shapes. In an example, the light emitting element LD may have a substantially rod-like shape or a substantially bar-like shape, which may be long in its length L direction (for example, its aspect ratio may be about greater than 1). In an embodiment, a length L of the light emitting element LD in the length direction may be larger than a diameter D (or a width of a cross-section) of the light emitting element LD. The light emitting element LD may include, for example, a light emitting diode (LED) fabricated small enough to have a diameter D and/or a length L to a degree of a nano scale to a micro scale.

The diameter D of the light emitting element LD may be in a range of about 0.5 µm to about 500 µm, and the length L of the light emitting element LD may be in a range of about 1 µm to about 10 µm. However, the diameter D and the length L of the light emitting element LD are not limited thereto, and the size of the light emitting element LD may be modified to be suitable for requirements (or design conditions) of a lighting device or a self-luminescent display device, to which the light emitting element LD may be applied.

The first semiconductor layer 11 may include, for example, at least one n-type semiconductor layer. For example, the first semiconductor layer 11 may include any one semiconductor material among InAlGaN, GaN, AlGaN, InGaN, AlN, and InN, and include an n-type semiconductor layer doped with a first conductive dopant (or n-type dopant) such as Si, Ge or Sn. However, the material constituting the first semiconductor layer 11 is not limited thereto. For example, the first semiconductor layer 11 may be configured with or formed of various materials. In an embodiment, the first semiconductor layer 11 may include a gallium nitride (GaN) semiconductor material doped with the first conductive dopant (or n-type dopant). The first semiconductor layer 11 may include an upper surface in contact with the active layer 12 and a lower surface exposed to the outside along the length L direction of the light emitting element LD. The lower surface of the first semiconductor layer 11 may be the one or an end portion (or lower end portion) of the light emitting element LD.

The active layer 12 is formed on the first semiconductor layer 11, and may be formed in a single or multiple quantum well structure. In an example, in a case that the active layer 12 is formed in the multiple quantum well structure, a barrier layer (not shown), a strain reinforcing layer, and a well layer, which constitute one unit, may be periodically and repeatedly stacked each other in the active layer 12. The strain reinforcing layer may have a lattice constant smaller than that of the barrier layer, to further reinforce strain, for example, compressive strain applied to the well layer. However, the structure of the active layer 12 is not limited to the above-described embodiment.

The active layer 12 may emit light having a wavelength in a range of about 400 nm to about 900 nm, and use a double hetero structure. In an embodiment, a clad layer (not shown) doped with a conductive dopant may be formed on the top and/or the bottom of the active layer 12 along the length L direction of the light emitting element LD. In an example, the clad layer may be formed as an AlGaN layer or InAlGaN layer. In an embodiment, a material such as AlGaN or AlInGaN may be used to form the active layer 12. For example, the active layer 12 may be configured with or formed of various materials. The active layer 12 may include a first surface in contact with the first semiconductor layer 11 and a second surface in contact with the second semiconductor layer 13.

In a case that an electric field having a predetermined voltage or more is applied to both the end portions of the light emitting element LD, the light emitting element LD emits light as electron-hole pairs are combined in the active layer 12. The light emission of the light emitting element LD is controlled by using such a principle, so that the light emitting element LD can be used as a light source (or light emitting source) for various light emitting apparatuses, including a pixel of a display device.

The second semiconductor layer 13 is formed on the second surface of the active layer 12, and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor layer doped with a second conductive dopant (or p-type dopant) such as Mg. However, the material constituting the second semiconductor layer 13 is not limited thereto. For example, the second semiconductor layer 13 may be configured with or formed of various materials. In an embodiment, the second semiconductor layer 13 may include a gallium nitride (GaN) semiconductor material doped with the second conductive dopant (or p-type dopant). The second semiconductor layer 13 may include a lower surface in contact with the second surface of the active layer 12 and an upper surface exposed to the outside along the length L direction of the light emitting element LD. The upper surface of the second semiconductor layer 13 may be the other end portion (or upper end portion) of the light emitting element LD.

In an embodiment, the first semiconductor layer 11 and the second semiconductor layer 13 may have different thicknesses in the length L direction of the light emitting element LD. In an example, the first semiconductor layer 11 may have a thickness relatively thicker than that of the second semiconductor layer 13 along the length L direction of the light emitting element LD. Accordingly, the active layer 12 of the light emitting element LD may be located or disposed more adjacent to the upper surface of the second semiconductor layer 13 than the lower surface of the first semiconductor layer 11.

Although it is illustrated that each of the first semiconductor layer 11 and the second semiconductor layer 13 is configured with or formed of one layer, the disclosure is not limited thereto. In an embodiment, each of the first semiconductor layer 11 and the second semiconductor layer 13 may further include at least one layer, for example, a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR may be configured with or formed of a p-type semiconductor layer such as p-GAlnP, p-AlInP or p-AlGaInP, but the disclosure is not limited thereto.

In an embodiment, the light emitting element LD may further include an additional electrode (not shown) (hereinafter, referred to as a 'first additional electrode') disposed on the top of the second semiconductor layer 13, in addition to the first semiconductor layer 11, the active layer 12, and the second semiconductor layer 13, which are described above. In other embodiments, the light emitting element LD may further include another additional electrode (not shown) (hereinafter, referred to as a 'second additional electrode') disposed at one or an end of the first semiconductor layer 11.

Each of the first and second additional electrodes may be an ohmic contact electrode, but the disclosure is not limited thereto. In an embodiment, each of the first and second additional electrodes may be a Schottky contact electrode. The first and second additional electrodes may include a conductive material. For example, the first and second additional electrodes may include an opaque metal using one or mixture of chromium (Cr), titanium (Ti), aluminum (Al), gold (Au), nickel (Ni), and any oxide or alloy thereof, but the disclosure is not limited thereto. In an embodiment, the first and second additional electrodes may include a transparent conductive oxide such as indium tin oxide (ITO), indium zinc oxide (IZO), zinc oxide (ZnO), indium gallium zinc oxide (ITZO), or indium tin zinc oxide (ITZO).

Materials respectively included in the first and second additional electrodes may be identical to or different from each other. The first and second additional electrodes may be substantially transparent or translucent. Accordingly, light generated in the light emitting element LD can be emitted to the outside of the light emitting element LD by passing through the first and second additional electrodes. In an embodiment, in a case that light generated in the light emitting element LD does not pass through the first and second additional electrodes and is emitted to the outside of the light emitting element LD through an area except both the end portions of the light emitting element LD, the first and second additional electrodes may include an opaque metal.

In an embodiment, the light emitting element LD may further include an insulative film 14. However, in an embodiment, the insulative film 14 may be omitted, and be provided or disposed to cover or overlap only portions of the first semiconductor layer 11, the active layer 12, and the second semiconductor layer 13.

The insulative film 14 can prevent an electrical short circuit that may occur in a case that the active layer 12 is in contact with a conductive material except the first semiconductor layer 11 and the second semiconductor layer 13. Also, the insulative film 14 minimizes a surface defect of the light emitting element LD, thereby improving the lifespan and light emission efficiency of the light emitting element LD. Also, in a case that a plurality of light emitting elements LD may be densely disposed, the insulative film 14 can prevent an unwanted short circuit that may occur between the light emitting elements LD. Whether the insulative film is provided is not limited as long as the active layer 12 can prevent occurrence of a short circuit with external conductive material.

The insulative film 14 may be provided in a shape entirely surrounding the outer circumference of the light emitting stack structure including the first semiconductor layer 11, the active layer 12, and the second semiconductor layer 13.

Although a case where the insulative film 14 is provided in a shape entirely surrounding the outer circumference of each of the first semiconductor layer 11, the active layer 12, and the second semiconductor layer 13 is described in the above-described embodiment, the disclosure is not limited thereto. In an embodiment, in a case that the light emitting element LD may include the first additional electrode, the insulative film 14 may entirely surround the outer circumference of each of the first semiconductor layer 11, the active layer 12, the second semiconductor layer 13, and the first additional electrode. In other embodiments, the insulative film 14 may not entirely surround the outer circumference of the first additional electrode, or may surround only a portion of the outer circumference of the first additional electrode and may not surround the other of the outer circumference of the first additional electrode. In an embodiment, in a case that the first additional electrode is disposed at the other end portion (or upper end portion) of the light emitting element LD and the second additional electrode is disposed at one or an end portion (or the other or another end portion) of the light emitting element LD, the insulative film 14 may expose at least one area of each of the first and second additional electrodes.

The insulative film 14 may include a transparent insulating material. For example, the insulative film 14 may include at least one insulating material selected from the group consisting of silicon oxide (SiOx), silicon nitride (SiNx), silicon oxynitride (SiON), aluminum oxide (AlOx), titanium dioxide ($TiO_2$), and the like within the spirit and the scope of the disclosure. However, the disclosure is not limited thereto, and various materials having insulating properties may be used as the material of the insulative film 14.

In an embodiment, the light emitting element LD may include a light emitting pattern having a core-shell structure. The first semiconductor layer 11 may be located or disposed at a core, for example, the middle (or center) of the light emitting element LD, the active layer 12 may be provided or disposed and/or formed in a shape surrounding the outer circumference of the first semiconductor layer 11, and the second semiconductor layer 13 may be provided or disposed and/or formed in a shape surrounding the active layer 12. Also, the light emitting element LD may further include an additional electrode (not shown) surrounding at least one or a side of the second semiconductor layer 13. In an embodiment, the light emitting element LD may further include an insulative film which may be provided or disposed on the outer circumference of the light emitting pattern having the core-shell structure and may include a transparent insulating material. The light emitting element LD including the light emitting pattern having the core-shell structure may be fabricated through a growth process.

The above-described light emitting element LD may be used as a light emitting source (or light source) for various display devices. The light emitting element LD may be fabricated through a surface treatment process. For example, in a case that a plurality of light emitting elements LD may be mixed in a liquid solution (or solvent) to be supplied to each pixel area (for example, a light emitting area of each pixel or a light emitting area of each sub-pixel), each light emitting element LD may be surface-treated such that the light emitting elements LD may not be unequally condensed in the solution but equally dispersed in the solution.

A light emitting unit (or light emitting apparatus) including the above-described light emitting element LD may be used in various types of devices that require a light source, including a display device. In a case that a plurality of light emitting elements LD may be disposed in a light emitting area of each pixel of a display panel, the light emitting elements LD may be used as a light source of the pixel. However, the application field of the light emitting element LD is not limited to the above-described example. For example, the light emitting element LD may be used for other types of devices that require a light source, such as a lighting device.

Figure 3:
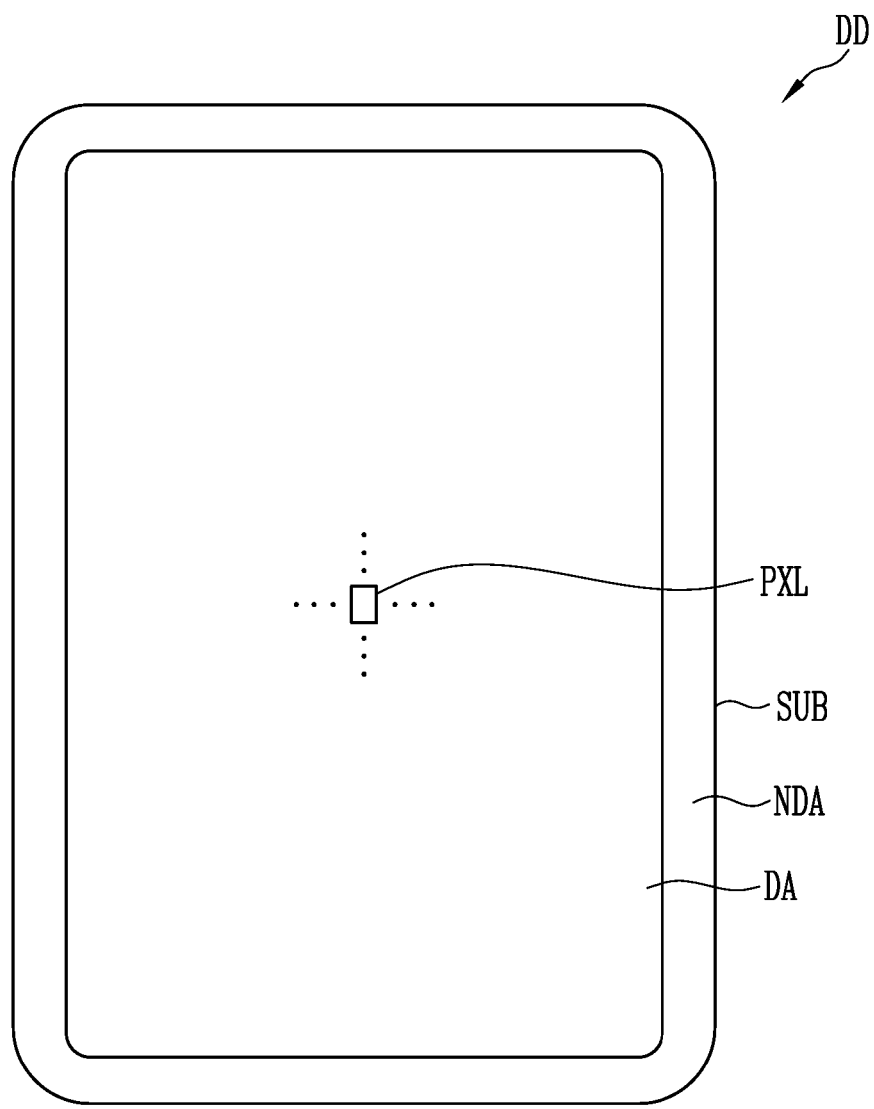
FIG. 3 is a plan view schematically illustrating a display device in accordance with an embodiment.

FIG. 3 is a plan view schematically illustrating a display device in accordance with an embodiment. FIG. 3 is a schematic plan view of a display device DD using, as a light source, the light emitting element LD shown in FIGS. 1 and 2. In FIG. 3, for convenience, a structure of the display device DD is briefly illustrated based on a display area DA in which an image is displayed.

Referring to FIGS. 1 to 3, the display device DD may include a substrate SUB, a plurality of pixels PXL which may be provided or disposed on the substrate SUB and each may include at least one light emitting element LD, a driving unit which may be provided or disposed on the substrate SUB and drives the pixels PXL, and a line unit which electrically connects the pixels PXL and the driving unit.

The disclosure may be applied as long as the display device DD is an electronic device in which a display surface may be applied to at least one or a surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device, for example, but the disclosure is not limited thereto.

The display device DD may be classified into a passive matrix type display device and an active matrix type display device according to a method of driving the light emitting element LD. In an example, in a case that the display device DD is implemented as the active matrix type display device, each of the pixels PXL may include a driving transistor for controlling an amount of current supplied to the light emitting element LD, a switching transistor for transferring a data signal to the driving transistor, and the like within the spirit and the scope of the disclosure.

The display device DD may be provided in various shapes. In an example, the display device may be provided in a substantially rectangular plate shape having two pairs of sides parallel to each other, but the disclosure is not limited thereto. In a case that the display device DD may be provided in the substantially rectangular plate shape, any one or a pair of sides among the two pairs of sides may be provided longer than the other pair of sides. For convenience, a case where the display device DD may be provided in a substantially rectangular shape having a pair of long sides and a pair of short sides is illustrated. An extending direction of the long sides is represented as a second direction DR2, an extending direction of the short sides is represented as a first direction DR1, and a direction perpendicular to the extending directions of the long sides and the short sides is represented as a third direction DR3. In the display device DD provided in the substantially rectangular plate shape, a corner portion at which one or a long side and one or a short side may be in contact with (or meet) each other may have a substantially round shape.

The substrate SUB may include the display area DA and a non-display area NDA.

The display area DA may be an area in which the pixels PXL for displaying an image may be provided. The non-display area NDA may be an area in which the driving unit for driving the pixels PXL and a portion of the line unit which electrically connects the pixels PXL and the driving unit may be provided. For convenience, only one pixel PXL is illustrated in FIG. 3, but a plurality of pixels PXL may be substantially provided or disposed in the display area DA of the substrate SUB.

The non-display area NDA may be provided at least one or a side of the display area DA. The non-display area NDA may surround or may be adjacent to the circumference (or edge) of the display area DA. The non-display area NDA may be provided with the line unit electrically connected to the pixels PXL and the driving unit which may be electrically connected to the line part and drives the pixels PXL.

The line unit may electrically connect the driving unit and the pixels PXL. The line unit may be a fan-out line which provides a signal to each pixel PXL and may be electrically connected to signal lines, for example, a scan line, a data line, an emission control line, and the like, which may be electrically connected to each pixel PXL. Also, the line unit may be a fan-out line electrically connected to signal lines, for example, a control line, a sensing line, and the like, which may be electrically connected to each pixel PXL, so as to compensate for an electrical characteristic change of each pixel PXL in real time.

The substrate SUB may include a transparent insulating material to enable light to be transmitted therethrough. The substrate SUB may be a rigid substrate or a flexible substrate.

One or an area on the substrate SUB may be provided as the display area DA such that the pixels PXL may be disposed therein, and the other or another area on the substrate SUB may be provided as the non-display area NDA.

Each of the pixels PXL may be provided or disposed in the display area DA on the substrate SUB. In an embodiment, the pixels PXL may be arranged or disposed in a stripe or PenTile® arrangement structure in the display area DA, but the disclosure is not limited thereto.

Each pixel PXL may include at least one light emitting element LD driven by a corresponding scan signal and a corresponding data signal. The light emitting element LD may have a size small to a degree of a micro scale or a nano scale, and be electrically connected in parallel to light emitting elements disposed adjacent thereto. However, the disclosure is not limited thereto. The light emitting element LD may constitute a light source of each pixel PXL.

Each pixel PXL may include at least one light source, for example, the light emitting element LD shown in FIGS. 1 and 2, which is driven by a predetermined signal (for example, a scan signal and a data signal) and/or a predetermined power source (for example, a first driving power source and a second driving power source). However, in an embodiment, the type of the light emitting element LD which can be used as the light source of the pixel PXL is not limited thereto.

The driving unit provides a predetermined signal and a predetermined power source to each pixel PXL through the line unit, and accordingly, the driving of the pixel PXL can be controlled. The driving unit may include a scan driver, an emission driver, a data driver, and a timing controller.

Figure 4:
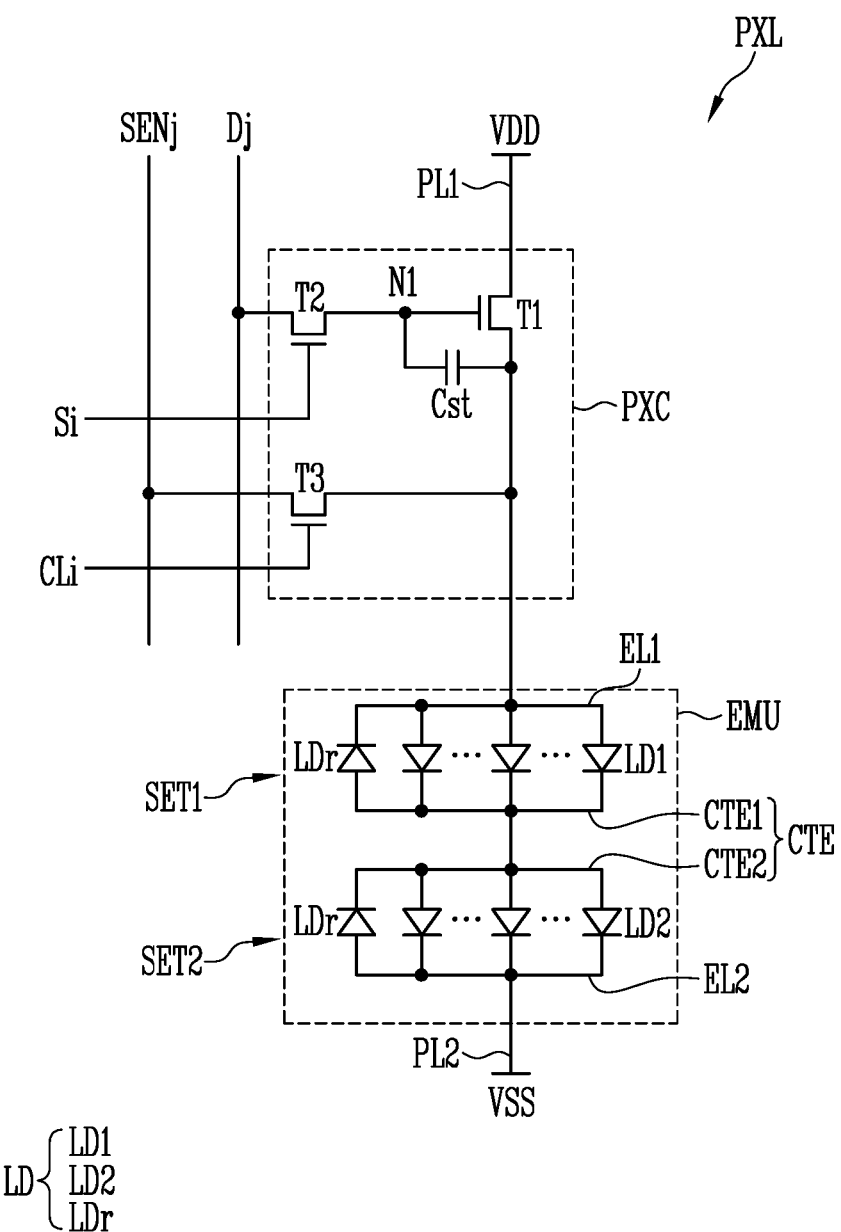
FIG. 4 is an equivalent circuit diagram illustrating an embodiment of an electrical connection relationship between components included in one pixel shown in FIG. 3.

FIG. 4 is an equivalent circuit diagram illustrating an embodiment of an electrical connection relationship between components included in one pixel shown in FIG. 3.

For example, FIG. 4 illustrates an embodiment of an electrical connection relationship between components included in the pixel PXL applicable to an active display device. However, the types of the components included in the pixel PXL to which an embodiment is applicable are not limited thereto.

In FIG. 4, the pixel PXL comprehensively may include not only components included in each of the pixels shown in FIG. 3 but also an area in which the components may be provided.

Referring to FIGS. 3 and 4, one pixel PXL (hereinafter, referred to as a 'pixel') may include a light emitting unit EMU which generates light with a luminance corresponding to a data signal. Also, the pixel PXL may selectively further include a pixel circuit PXC for driving the light emitting unit EMU.

The pixel circuit PXC may be electrically connected to a scan line Si and a data line Dj of a corresponding pixel PXL. In an example, in a case that assuming that a pixel PXL is disposed on an ith (i is a natural number) row and a jth (j is a natural number) column of the display area DA, the pixel circuit PXC of the pixel PXL may be electrically connected to an ith scan line Si and a jth data line Dj of the display area DA. Also, the pixel circuit PXC may be electrically connected to an ith control line CLi and a jth sensing line SENj of the display area DA.

The above-described pixel circuit PXC may include first to third transistors T1 to T3 and a storage capacitor Cst.

A first terminal of the second transistor T2 (switching transistor) may be electrically connected to the jth data line Dj, and a second terminal of the second transistor T2 may be electrically connected to a first node N1. The first terminal and the second terminal of the second transistor T2 may be different terminals. For example, in a case that the first terminal may be a source electrode, the second terminal may be a drain electrode. For example, a gate electrode of the second transistor T2 may be electrically connected to the ith scan line Si.

The second transistor T2 is turned on in a case that a scan signal having a voltage at which the second transistor T2 can be turned on is supplied from the ith scan line Si, to electrically connect the jth data line Dj and the first node N1. A data signal of a corresponding frame is supplied to the jth data line Dj. Accordingly, the data signal is transferred to the first node N1. The data signal transferred to the first node N1 is charged in the storage capacitor Cst.

A first terminal of the first transistor T1 (driving transistor) may be electrically connected to a first driving power source VDD, and a second terminal of the first transistor T1 may be electrically connected to a first electrode EL1 of each of light emitting elements LD. A gate electrode of the first transistor T1 may be electrically connected to the first node N1. The first transistor T1 may control of an amount of driving current supplied to the light emitting elements LD, corresponding to a voltage of the first node N1.

The third transistor T3 may be electrically connected between the first transistor T1 and the jth sensing line SENj. For example, a first terminal of the third transistor T3 may be connected to the first terminal of the first transistor T1 electrically connected to the first electrode EL1, and a second terminal of the third transistor T3 may be electrically connected to the jth sensing line SENj. A gate electrode of the third transistor T3 may be electrically connected to the jth control line CLi. The third transistor T3 is turned on by a control signal having a gate-on voltage, which is supplied to the ith control line CLi during a predetermined sensing period, to electrically connect the jth sensing line SENj and the first transistor T1.

The sensing period may be a period in which characteristic information (for example, a threshold voltage of the first transistor T1, for example) of each of the pixels PXL arranged or disposed in the display area DA.

One or an electrode of the storage capacitor Cst may be electrically connected to the first driving power source VDD, and the other or another electrode of the storage capacitor Cst may be electrically connected to the first node N1. The storage capacitor Cst may charge a voltage corresponding to the data signal supplied to the first node N1, and maintain the charged voltage until a data signal of a next frame is supplied.

The light emitting unit EMU may include a plurality of light emitting elements LD electrically connected in parallel between a first power line PL1 to which a voltage of the first driving power source VDD may be applied and a second power line PL2 to which a voltage of a second driving power source VSS may be applied. For example, the light emitting unit EMU may include a first electrode EL1 (or "first alignment electrode") electrically connected to the first driving power source VDD via the pixel circuit PXC and the first power line PL1, a second electrode EL2 (or "second alignment electrode") electrically connected to the second driving power source VSS through the second power line PL2, and a plurality of light emitting elements LD electrically connected in parallel in the same direction between the first and second electrodes EL1 and EL2.

Each of the light emitting elements LD included in the light emitting unit EMU may include one or an end portion electrically connected to the first driving power source VDD through the first electrode EL1 and the other or another end portion electrically connected to the second driving power source VSS through the second electrode EL2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set to a threshold voltage of the light emitting elements LD during an emission period of the pixel PXL.

As described above, the light emitting elements LD electrically connected in parallel in the same direction (for example, a forward direction) between the first electrode EL1 and the second electrode EL2, to which voltages having difference potentials may be supplied, may form effective light sources, respectively. The effective light sources may constitute the light emitting unit EMU of the pixel PXL.

Each of the light emitting elements LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through the light emitting elements LD. Accordingly, the light emitting unit EMU can emit light with a luminance corresponding to the driving current while each light emitting element LD is emitting light with a luminance corresponding to a current flowing therethrough.

In an embodiment, the light emitting unit EMU may further include at least one ineffective light source, for example, a reverse light emitting element LDr, in addition to the light emitting elements LD forming the respective effective light sources. The reverse light emitting element LDr may be electrically connected in parallel together with the light emitting elements LD forming the effective light sources between the first and second electrodes EL1 and EL2, and may be electrically connected between the first and second electrodes EL1 and EL2 in a direction opposite to that in which the light emitting elements LD may be electrically connected. Although a predetermined driving voltage (for example, a forward driving voltage) may be applied between the first and second electrodes EL1 and EL2, the reverse light emitting element LDr maintains an inactivated state, and accordingly, no current substantially flows through the reverse light emitting element LDr.

Each light emitting unit EMU may include at least one serial stage including a plurality of light emitting elements LD electrically connected in parallel to each other. For example, the light emitting unit EMU may be in a series/parallel hybrid structure as shown in FIG. 4.

The light emitting unit EMU may include first and second serial stages SET1 and SET2 sequentially electrically connected between the first and second driving power sources VDD and VSS. Each of the first and second serial stages SET1 and SET2 may include two electrodes EL1 and CTE1, or CTE2 and EL2 constituting an electrode pair of a corresponding serial stage, and a plurality of light emitting elements LD electrically connected in parallel in the same direction between the two electrodes EL1 and CTE1, or CTE2 and EL2.

The first serial stage SET1 may include the first electrode EL1 and a first intermediate electrode CTE1, and include at least one first light emitting element LD1 electrically connected between the first electrode EL1 and the first intermediate electrode CTE1. Also, the first serial stage SET1 may include a reverse light emitting element LDr electrically connected in a direction opposite to that of the first light emitting element LD1 between the first electrode EL1 and the first intermediate electrode CTE1.

The second serial stage SET2 may include a second intermediate electrode CTE2 and the second electrode EL2, and include at least one second light emitting elements LD2 electrically connected between the second intermediate electrode CTE2 and the second electrode EL2. Also, the second serial stage SET2 may include a reverse light emitting element LDr electrically connected in a direction opposite to that of the second light emitting element LD2 between the second intermediate electrode CTE2 and the second electrode EL2.

The first intermediate electrode CTE1 of the first serial stage SET1 and the second intermediate electrode CTE2 of the second serial stage SET2 may be integral with each other to be electrically connected to each other. For example, the first intermediate electrode CTE1 and the second intermediate electrode CTE2 may constitute an intermediate electrode CTE electrically connecting the first serial stage SET1 and the second serial stage SET2, which may be consecutive. In a case that the first intermediate electrode CTE1 and the second intermediate electrode CET2 may be integral with each other, the first intermediate electrode CTE1 and the second intermediate electrode CET2 may be different areas of the intermediate electrode CTE.

In the above-described embodiment, the first electrode EL1 of the first serial stage SET1 may be an anode electrode of a light emitting unit EMU of each pixel PXL, and the second electrode EL2 of the second serial stage SET2 may be a cathode electrode of the light emitting unit EMU.

Although an embodiment in which all the first to third transistors T1, T2, and T3 are N-type transistors is illustrated in FIG. 4, the disclosure is not limited thereto. For example, at least one of the first to third transistors T1, T2, and T3 may be replaced with a P-type transistor. Also, although an embodiment in which the light emitting unit EMU may be electrically connected between the pixel circuit PXC and the second driving power source VSS is illustrated in FIG. 4, the light emitting unit EMU may be electrically connected between the first driving power source VDD and the pixel circuit PXC.

The structure of the pixel circuit PXC may be variously modified and embodied. In an example, the pixel circuit PXC may further include at least one transistor such as a transistor for initializing the first node N1 and/or a transistor for controlling an emission time of the light emitting elements LD, or other circuit elements such as a boosting capacitor for boosting the voltage of the first node N1.

The structure of a pixel PXL applied to the disclosure is not limited to an embodiment shown in FIG. 4, and the corresponding pixel PXL may have various structures. For example, each pixel PXL may be applicable to a passive type light emitting display device, etc. The pixel circuit PXC may be omitted, and both the end portions of the light emitting elements LD included in the light emitting unit EMU may be directly electrically connected to the ith scan line Si, the jth data line Dj, the first power line PL1 to which the first driving power source VDD may be applied, the second power line PL2 to which the second driving power source VSS may be applied, and/or a predetermined control line.

Figure 5:
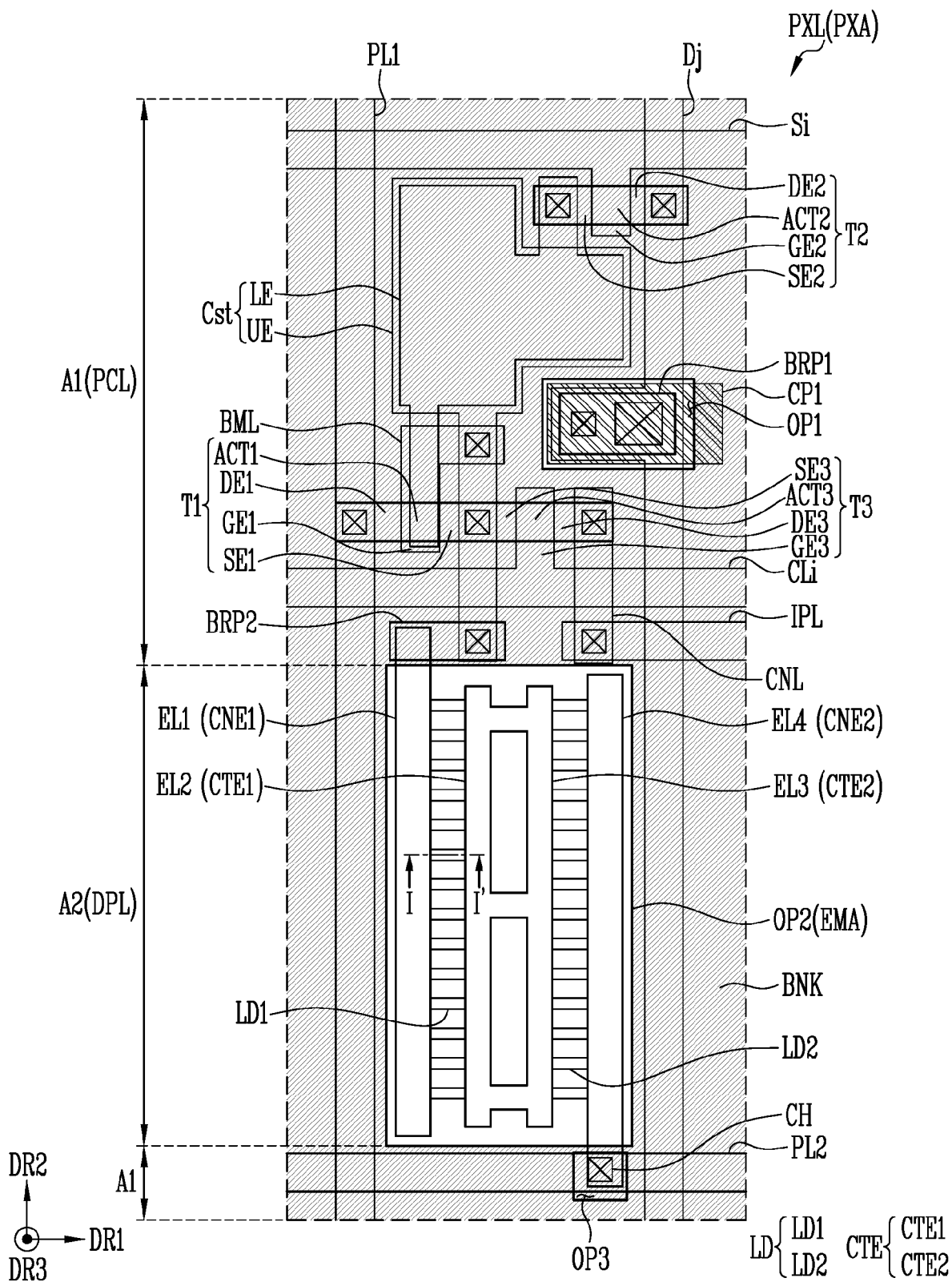
FIG. 5 is a plan view schematically illustrating the pixel shown in FIG. 4.
Figure 6:
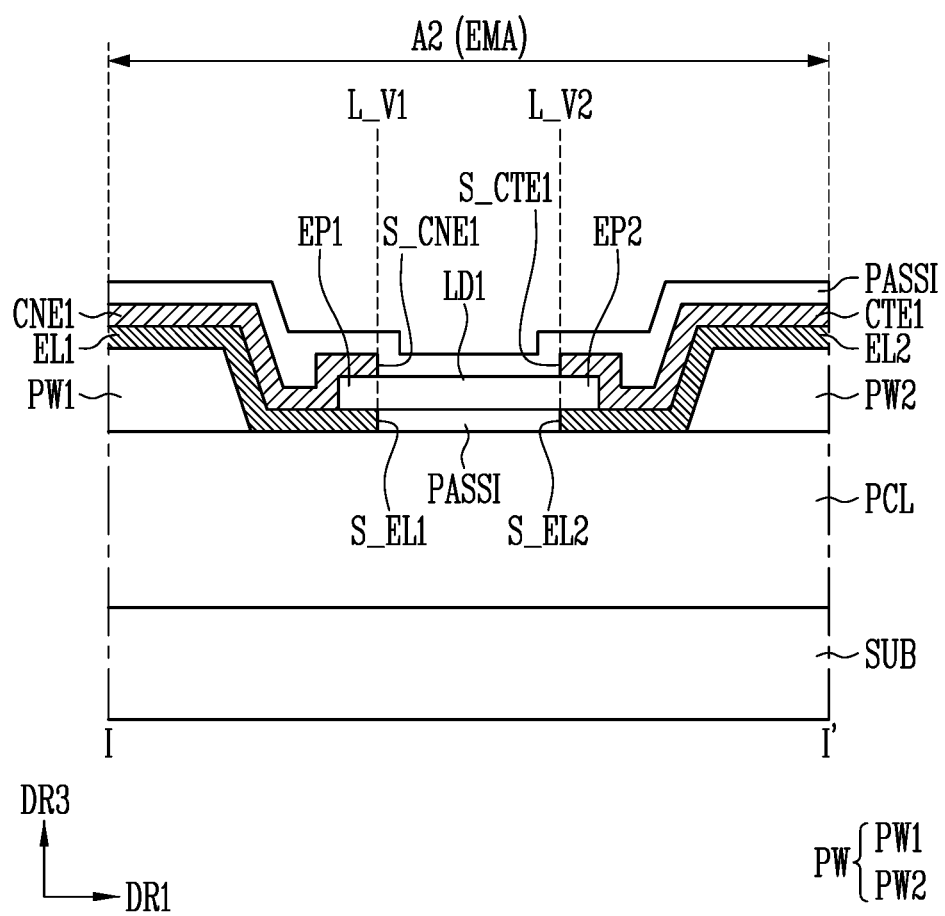
FIG. 6 is a schematic cross-sectional view of the pixel taken along line I-I' shown in FIG. 5.

FIG. 5 is a plan view schematically illustrating the pixel shown in FIG. 4. FIG. 6 is a schematic cross-sectional view of the pixel taken along line I-I' shown in FIG. 5.

For convenience, based on one pixel PXL disposed in an intersection area of a jth pixel column and an ith pixel row, a scan line Si, a control line CLi, a data line Dj, power lines PL1 and PL2, and an initialization power line IPL, which may be electrically connected to the pixel PXL, are illustrated in FIG. 5.

For example, for convenience of description, in lines provided in the pixel PXL, a data line Dj on a jth column, to which a data signal may be applied, is referred to as a "data line Dj," a scan line on an ith row is referred to as a "scan line Si," a power line to which the first driving power source VDD may be applied is referred to as a "first power line PL1," and a power line to which the second driving power source VSS may be applied is referred to as a "second power line PL2."

Although an embodiment in which an emission area EMA of each pixel PXL may include light emitting elements LD disposed in two serial stages has been illustrated in FIGS. 4 to 6, the disclosure is not limited thereto, and a number of serial stages disposed in the emission area EMA may be variously changed in an embodiment.

In FIGS. 5 and 6, the one pixel PXL is simplified and illustrated, such as a case where each electrode is illustrated as only a single-layered electrode and a case where each of a plurality of insulating layers is illustrated as only a single-layered insulating layer. However, the disclosure is not limited thereto.

In an embodiment of the disclosure, the term "being formed and/or provided in the same layer" may mean being formed in the same process, and the term "being formed and/or provided in different layers" may mean being formed in different processes.

Referring to FIGS. 3 to 6, the pixel PXL in accordance with an embodiment may be disposed in a pixel area PXA provided or disposed in the display area DA of the substrate SUB.

A plurality of insulating layers and a plurality of conductive layers may be disposed on the substrate SUB.

The insulating layers may include, for example, a buffer layer, a gate insulating layer, interlayer insulating layers, a protective layer, a passivation layer PASSI, and the like, which may be sequentially provided or disposed on the substrate SUB.

Each of the plurality of insulating layers may be provided in a form including an organic insulating layer, an inorganic insulating layer, or the organic insulating layer disposed on the inorganic insulating layer. The inorganic insulating layer may include, for example, at least one of silicon nitride (SiNx), silicon oxide (SiOx), silicon oxynitride (SiON), and metal oxide such as aluminum oxide (AlOx). The organic insulating layer may include, for example, at least one of polyacrylates resin, epoxy resin, phenolic resin, polyamides resin, polyimides resin, unsaturated polyesters resin, polyphenylene ethers resin, poly-phenylene sulfides resin, and benzocyclobutenes resin.

The conductive layers may be provided or disposed and/or formed between the above-described insulating layers. The conductive layers may include, for example, a first conductive layer (for example, a bottom metal layer BML) provided or disposed on the substrate SUB, a second conductive layer (for example, a gate electrode of a transistor) provided or disposed on the gate insulating layer, a third conductive layer (for example, a source electrode and/or a drain electrode of the transistor) provided or disposed on the interlayer insulating layers, a fourth conductive layer (for example, a bridge pattern electrically connecting the transistor and the light emitting unit EMU) provided or disposed on the protective layer, and the like within the spirit and the scope of the disclosure. Each of the conductive layers may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which is a low-resistance material so as to decrease wiring resistance. A conductive layer including a conductive material having a specific or given characteristic will be individually described.

However, the insulating layers and the conductive layers, which may be provided or disposed on the substrate SUB, are not limited to the above-described embodiment. In an embodiment, another insulating layer and another conductive layer in addition to the insulating layers and the conductive layers may be provided or disposed on the substrate SUB.

A line unit electrically connected to the pixel PXL may be located or disposed on a top surface (for example, a surface in the third direction DR3) of the substrate SUB. The line unit may include a plurality of signal lines for transferring a predetermined signal (or a predetermined voltage) to the pixel PXL. The signal lines may include a data line Dj, a control line CLi, a first power line PL1, a second power line PL2, and an initialization power line IPL.

The scan line Si may extend in the first direction DR1 (or a horizontal direction). A scan signal may be applied to the scan line Si. The scan line Si may be the ith scan line Si described with reference to FIG. 4.

The data line Dj may extend in the second direction DR2 (or a vertical direction). A data signal may be applied to the data line Dj. The data line Dj may be the jth data line Dj described with reference to FIG. 4. The data line Dj may be electrically connected to a second transistor T2 of the pixel PXL.

The control line CLi may extend along the first direction DR1 to be spaced apart from the scan line Si. A control signal may be applied to the control line CLi. The control line CLi may be the ith control line CLi described with reference to FIG. 4. The control line CLi may be provided or disposed and/or formed in the same layer as the scan line Si.

The voltage of the first driving power source VDD may be applied to the first power line PL1. The first power line PL1 may be the first power line PL1 described with reference to FIG. 4. The first power line PL1 may extend along the second direction DR2, and be disposed to be spaced apart from the data line Dj in the first direction DR1 in the pixel area PXA. The first power line PL1 may be provided or disposed in the same layer as the data line Dj.

The voltage of the second driving power source VSS may be applied to the second power line PL2. The second power line PL2 may be the second power line PL2 described with reference to FIG. 4. The second power line PL2 may extend along the first direction DR1.

The initialization power line IPL may extend in the first direction DR1, and be disposed to be spaced apart from the control line CLi. The initialization power line IPL may be the jth sensing line SENj described with reference to FIG. 4. The initialization power line IPL may be electrically connected to a third transistor T3 disposed in the pixel area PXA. A voltage of an initialization power source may be applied to the initialization power line IPL. The scan line Si, the control line CLi, and the initialization power line IPL may be provided or disposed and/or formed in the same layer.

Light emitting elements LD may be located or disposed in an emission area EMA of the pixel area PXA, circuit elements for driving the light emitting elements LD may be disposed in a peripheral area of the pixel area PXA.

In an embodiment, the pixel area PXA may include a first area A1 and a second area A2 partitioned along one or a direction, for example, the second direction DR2. A pixel circuit layer PCL may be located or disposed in the first area A1, and a display element layer DPL may be located or disposed in the second area A2. The first area A1 may correspond to a peripheral area adjacent to the emission area EMA, and the second area A2 may correspond to the emission area EMA. The peripheral area may include a non-emission area in which no light is emitted.

For convenience, after the pixel circuit layer PCL is described, the display element layer DPL will be described.

The pixel circuit layer PCL may include a bottom metal layer BML located or disposed in the first area A1, a pixel circuit (see 'PXC' shown in FIG. 4), and signal lines electrically connected to the pixel circuit PXC.

The bottom metal layer BML may be provided or disposed and/or formed on the substrate SUB. The bottom metal layer BML may be a light blocking layer for blocking light introduced through a lower surface of the substrate SUB from advancing toward a first transistor T1 of the pixel PXL. For example, the bottom metal layer BML may block the light introduced through the lower surface of the substrate SUB from advancing toward a semiconductor layer of the first transistor T1, thereby preventing malfunction of the first transistor T1. To this end, the bottom metal layer BML may be located or disposed on the substrate SUB to overlap the first transistor T1. In an example, the bottom metal layer BML may be located or disposed on the substrate SUB to overlap a first gate electrode GE1 of the first transistor T1.

The bottom metal layer BML may be electrically and/or physically connected to an upper electrode UE of a storage capacitor Cst through a contact hole CH penetrating a plurality of insulating layers.

The upper electrode UE may overlap the bottom metal layer BML when viewed in a plan view. The upper electrode UE may be provided or disposed in the same layer as the data line Dj and the first power line PL1, include the same or similar material as the data line Dj and the first power line PL1, and be formed through the same process as the data line Dj and the first power line PL1.

One or a region of the upper electrode UE may be electrically connected to the bottom metal layer BML, through the contact hole CH penetrating the plurality of insulating layers. For example, another region of the upper electrode UE may be electrically connected to a first source region SE1 of the first transistor T1 through a contact hole CH penetrating a plurality of insulating layers. As a result, the bottom metal layer BML may be connected to the first source region SE1 of the first transistor T1.

As described above, in a case that the bottom metal layer BML is connected to the first source region SE1 of the first transistor T1, a swing width margin of the second driving power source VSS can be secured. The driving range of a gate voltage applied to the first gate electrode GE1 of the first transistor T1 can be widened.

The pixel circuit PXC may include the first to third transistors T1 to T3 and the storage capacitor Cst, which may be provided or disposed on the substrate SUB.

The first transistor T1 may be the first transistor T1 described with reference to FIG. 4, the second transistor T2 may be the second transistor T2 described with reference to FIG. 4, and the third transistor T3 may be the third transistor T3 described with reference to FIG. 4.

The first transistor T1 may include the first gate electrode GE1, a first active pattern ACT1, the first source region SE1, and a first drain region DE1.

The first gate electrode GE1 may be electrically connected to a second source region SE2 of the second transistor T2 through a contact hole CH penetrating a plurality of insulating layers.

The first active pattern ACT1, the first source region SE1, and the first drain region DE1 may be a semiconductor pattern made of poly-silicon, amorphous silicon, oxide semiconductor, for example. The first active pattern ACT1, the first source region SE1, and the first drain region DE1 may be configured with or formed of a semiconductor layer undoped or doped with an impurity. In an example, the first source region SE1 and the first drain region DE1 may be configured with or formed of a semiconductor layer doped with the impurity, and the first active pattern ACT1 may be configured with or formed of a semiconductor layer undoped with the impurity. The impurity may include, for example, an n-type impurity.

The first active pattern ACT1 may be a region overlapping the first gate electrode GE1, and may be a channel region of the first transistor T1. In a case that the first active pattern ACT1 is formed long, the channel region of the first transistor T1 may be formed long. The driving range of a gate voltage (or gate signal) applied to the first transistor T1 may be widened. Thus, the grayscale of light (or beam) emitted from light emitting elements LD can be minutely controlled.

The first source region SE1 may be electrically connected to (or in electrically contact with) one or an end of the first active pattern ACT1. Also, the first source region SE1 may be electrically connected to the upper electrode UE through a contact hole CH penetrating a plurality of insulating layers.

The first drain region DE1 may be electrically connected to (or in contact with) the other end of the first active pattern ACT1. Also, the first drain region DE1 may be electrically connected to the first power line PL1 through a contact hole CH penetrating a plurality of insulating layers. Accordingly, the voltage of the first driving voltage VDD can be applied to the first drain region DE1.

The second transistor T2 may include a second gate electrode GE2, a second active pattern ACT2, the second source region SE2, and a second drain region DE2.

The second gate electrode GE2 may be integral with the scan line Si. The second gate electrode GE2 may be provided as a portion of the scan line Si or may be provided in a shape substantially protruding from the scan line Si.

Although a case where the second gate electrode GE2 may be integral with the scan line Si to be electrically connected to the scan line Si has been described in the above-described embodiment, the disclosure is not limited thereto. In an embodiment, the second gate electrode GE2 may be non-integral with the scan line Si to be electrically connected to the scan line Si through a separate connection means, for example.

The second active pattern ACT2, the second source region SE2, and the second drain region DE2 may be a semiconductor pattern made of poly-silicon, amorphous silicon, oxide semiconductor, for example. The second active pattern ACT2, the second source region SE2, and the second drain region DE2 may be configured with or formed of a semiconductor layer undoped or doped with an impurity. In an example, the second source region SE2 and the second drain region DE2 may be configured with or formed of a semiconductor layer doped with the impurity, and the second active pattern ACT2 may be configured with or formed of a semiconductor layer undoped with the impurity. The impurity may include, for example, an n-type impurity.

The second active pattern ACT2 may be a region overlapping the second gate electrode GE2, and may be a channel region of the second transistor T2.

The second source region SE2 may be electrically connected to (or in contact with) one or an end of the second active pattern ACT2. Also, the second source region SE2 may be electrically connected to the first gate electrode GE1 of the first transistor T1 through a contact hole penetrating a plurality of insulating layers.

The second drain electrode DE2 may be electrically connected to (or in contact with) the other end of the second active pattern ACT2. Also, the second drain electrode DE2 may be electrically connected to the data line Dj through a contact hole CH penetrating a plurality of insulating layers.

The third transistor T3 may include a third gate electrode GE3, a third active pattern ACT3, a third source region SE3, and a third drain region DE3.

The third gate electrode GE3 may be integral with the control line CLi. The third gate electrode GE3 may be provided as a portion of the control line CLi or be provided in a shape substantially protruding from the control line CLi.

Although a case where the third gate electrode GE3 may be integral with the control line CLi to be electrically connected to the control line CLi has been described in the above-described embodiment, the disclosure is not limited thereto. In an embodiment, the third gate electrode GE3 may be non-integral with the control line CLi to be electrically connected to the control line CLi through a separate connection means, for example.

The third active pattern ACT3, the third source region SE3, and the third drain region DE3 may be a semiconductor pattern made of poly-silicon, amorphous silicon, oxide semiconductor, for example. The third active pattern ACT3, the third source region SE3, and the third drain region DE3 may be configured with or formed of a semiconductor layer undoped or doped with an impurity. In an example, the third source region SE3 and the third drain region DE3 may be configured with or formed of a semiconductor layer doped with the impurity, and the third active pattern ACT3 may be configured with or formed of a semiconductor layer undoped with the impurity. The impurity may include, for example, an n-type impurity.

The third active pattern ACT3 may be a region overlapping the third gate electrode GE3, and may be a channel region of the third transistor T3.

The third source region SE3 may be electrically connected to (or in contact with) one or an end of the third active pattern ACT3. Also, the third source region SE3 may be electrically connected to the first source region SE1 of the first transistor T1.

The third drain region DE3 may be electrically connected to (or in electrically contact with) the other end of the third active pattern ACT3. Also, the third drain region DE3 may be electrically connected to the initialization power line IPL through a connection line CNL.

One or an end of the connection line CNL may be electrically connected to the third drain region DE3 through a contact hole CH penetrating a plurality of insulating layers. The other or another end of the connection line CNL may be electrically connected to the initialization power line IPL through a contact hole CH penetrating a plurality of insulating layers.

The storage capacitor Cst may include a lower electrode LE and the upper electrode UE. The storage capacitor Cst may be the storage capacitor Cst described with reference to FIG. 4.

The lower electrode LE may be integral with the first gate electrode GE1. In a case that the lower electrode LE may be integral provided with the first gate electrode GE1, the lower electrode LE may be one or a region of the first gate electrode GE1.

The upper electrode UE may be disposed to overlap the lower electrode LE when viewed in a plan view, and be designed to have an area (or size) greater than that of the lower electrode LE. The upper electrode UE may overlap the first source region SE1 when viewed in a plan view, and overlap the bottom metal layer BML. The upper electrode UE may be provided or disposed and/or formed in the same layer as the data line Dj and the first power line PL1.

The upper electrode UE may be electrically connected to the first source region SE1 of the first transistor T1, the third source region of the third transistor T3, and the bottom metal layer BML.

The pixel circuit layer PCL may further include first and second bridge patterns BRP1 and BRP2 located or disposed in the first area A1 of the pixel area PXA.

The first bridge pattern BRP1 may be the fourth conductive layer provided or disposed on the protective layer. The first bridge pattern BRP1 may be a first intermediate medium for electrically connecting the data line Dj and a pad electrode while overlapping a first opening OP1 of a bank BNK. The first bridge pattern BRP1 may be provided or disposed in the same layer as the second power line PL2, include the same or similar material as the second power line PL2, and be formed through the same process as the second power line PL2.

One or an end of the first bridge pattern BRP1 may be electrically connected to the data line Dj through a contact hole CH penetrating a plurality of insulating layers. The other or another end of the first bridge pattern BRP1 may be electrically connected to a first conductive pattern CP1 through a contact hole CH penetrating a plurality of insulating layers.

The second bridge pattern BRP2 may be an intermediate medium for electrically connecting a component, for example, the storage capacitor Cst of the pixel circuit layer PCL and a component, for example, a first electrode EL1 of the display element layer DPL.

One or an end of the second bridge pattern BRP2 may be electrically connected to the upper electrode UE through a contact hole CH penetrating a plurality of insulating layers. The other or another end of the bridge pattern BRP2 may be electrically connected to the first electrode EL1.

In the above-described embodiment, the data line Dj and the first power line PL1 may be provided or disposed throughout both the first and second areas A1 and A2 of the pixel area PXA.

The bank BNK may be provided or disposed and/or formed on the pixel circuit layer PCL shown in FIG. 6.

The bank BNK may be a structure defining (or partitioning) a pixel area PXA or an emission area EMA of each of a corresponding pixel PXL and pixels PXL adjacent thereto. In an example, the bank BNK may be a pixel defining layer. In a process of supplying light emitting elements LD to the pixel PXL, the bank BNK may be a pixel defining layer or a dam structure, which defines an emission area EMA to which the light emitting elements LD may be supplied. In an example, an emission area EMA of the pixel PXL is partitioned by the bank BNK, so that a mixed liquor (for example, ink) including a desired amount and/or a desired type of light emitting elements LD can be supplied (or input) to the emission area EMA.

The bank BNK may include at least one light blocking material and/or at least one reflective material, to prevent a light leakage defect in which light (or beam) is leaked between each pixel PXL and pixels PXL adjacent thereto. In an embodiment, the bank BNK may include a transparent material (or substance). In an example, the transparent material may include polyamides resin, polyimides resin, for example, but the disclosure is not limited thereto. In an embodiment, a reflective material layer may be separately provided or disposed and/or formed on the bank BNK so as to further improve the efficiency of light emitted from each pixel PXL.

The bank BNK may include at least one opening exposing components located or disposed under or below the bank BNK in the pixel area PXA of the pixel PXL. The emission area EMA of the pixel PXL may be defined by the opening of the bank BNK. In an example, the bank BNK may include first to third openings OP1 to OP3, which expose components located or disposed under or below the bank BNK in the pixel area PXA of the pixel PXL. The emission area EMA of the pixel PXL may correspond to the second opening OP2 of the bank BNK.

The first opening OP1 of the bank BNK may be located or disposed in the first area A1 of the pixel area PXA. The first opening OP1 may be located or disposed to be spaced apart from the second opening OP2. The first opening OP1 of the bank BNK may overlap the first bridge pattern BRP1.

The second opening OP2 of the bank BNK may be disposed in the second area A2 of the pixel area PXA. The second opening OP2 may be located or disposed to be spaced apart from the first and third openings OP1 and OP3. The second opening OP2 may overlap light emitting elements LD and electrodes for applying an electrical signal to the light emitting elements LD.

The third opening OP3 of the bank BNK may be located or disposed in the first area A1 of the pixel area PXA. The third opening OP3 may be located or disposed to be spaced apart from the second opening OP2. The third opening OP3 may overlap an electrical contact part of the second power line PL2 and a fourth electrode EL4.

The first conductive pattern CP1 may be a second intermediate medium electrically connected to the first bridge pattern BRP1 to electrically connect the data line Dj and the pad electrode. In an embodiment, the first conductive pattern CP1 along with the first bridge pattern BRP1 may be a connection means for electrically connecting the data line Dj and the pad electrode.

Next, the display element layer DPL of the pixel PXL will be described.

The display element layer DPL may include first to fourth electrodes EL1 to EL4, light emitting elements LD, first and second contact electrodes CNE1 and CNE2, and an intermediate electrode CTE, which may be located or disposed in the second area A2 of the pixel area PXA in which the pixel PXL is disposed. In an embodiment, the display element layer DPL may further include a color filter and a color conversion layer.

Also, the display element layer DPL may include the same insulating layers as the pixel circuit layer PCL. In an embodiment, as shown in FIG. 6, the first and second electrodes EL1 and EL2, a first light emitting element LD1, the first contact electrode CNE1, and a first intermediate electrode CTE1 of the display element layer DPL may be disposed on the pixel circuit layer PCL (or a layer corresponding thereto).

The first electrode EL1, the second electrode EL2, the third electrode EL3, and the fourth electrode EL4 may be provided or disposed/and formed on the substrate SUB.

The first electrode EL1, the second electrode EL2, the third electrode EL3, and the fourth electrode EL4 may be sequentially arranged or disposed along the first direction DR1. The first electrode EL1, the second electrode EL2, the third electrode EL3, and the fourth electrode EL4 may extend in a direction different from the first direction DR1, for example, the second direction DR2 intersecting the first direction DR1. The first to fourth electrodes EL1 to EL4 may be separated from other electrodes (for example, electrodes provided or disposed in adjacent pixels PXL adjacent to each other in the second direction DR2) after light emitting elements LD may be supplied and aligned in the pixel area PXA in a fabricating process of the display device DD.

In the emission area EMA of the pixel PXL, each of the first to fourth electrodes EL1 to EL4 may be disposed to be spaced apart from an adjacent electrode along the first direction DR1. In an example, the first electrode EL1 may be disposed to be spaced apart from the second electrode EL2, the second electrode EL2 may be disposed to be spaced apart from the third electrode EL3, and the third electrode EL3 may be disposed to be spaced apart from the fourth electrode EL4. A distance between the first electrode EL1 and the second electrode EL2, a distance between the second electrode EL2 and the third electrode EL3, and a distance between the third electrode EL3 and the fourth electrode EL4 may be equal to one another, but the disclosure is not limited thereto. In an embodiment, the distance between the first electrode EL1 and the second electrode EL2, the distance between the second electrode EL2 and the third electrode EL3, and the distance between the third electrode EL3 and the fourth electrode EL4 may be different from one another.

In an embodiment, each of the first to fourth electrodes EL1 to EL4 may be made of a conductive material (or substance) having a constant reflexibility. The conductive material (or substance) may include an opaque metal (or opaque conductive material). The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In an embodiment, each of the first to fourth electrodes EL1 to EL4 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylenedioxythiophene) PEDOT, and the like within the spirit and the scope of the disclosure. In a case that each of the first to fourth electrodes EL1 to EL4 may include the transparent conductive material (or substance), a separate conductive layer may be additionally included, which is made of an opaque metal for reflecting light emitted from the light emitting elements LD in an image display direction of the display device.

Each of the first to fourth electrodes EL1 to EL4 may be provided and/or formed as a single layer, but the disclosure is not limited thereto. In an embodiment, each of the first to fourth electrodes EL1 to EL4 may be provided and/or formed as a multi-layer in which two or more materials among metals, alloys, conductive oxides, and conductive polymers may be stacked each other. Each of the first to fourth electrodes EL1 to EL4 may be provided as a multi-layer including at least two layers so as to minimize distortion caused by a signal delay in a case that a signal (or voltage) is transferred to both end portions of each of the light emitting elements LD.

A portion of the first electrode EL1 may extend to the first area A1 of the pixel PXL to overlap the second bridge pattern BRP2. In an example, a portion of the first electrode EL1 may be provided or disposed on the second bridge pattern BRP2 in the first area A1. Accordingly, the first electrode EL1 may be electrically and/or physically connected to the second bridge pattern BRP2.

A portion of the fourth electrode EL4 extend to the first area A1 of the pixel PXL to overlap the second power line PL2. In an example, a portion of the fourth electrode EL4 may be provided or disposed on the second power line PL2 in the first area A1. Accordingly, the fourth electrode EL4 may be electrically and/or physically connected to the second power line PL2.

Each of the first to fourth electrodes EL1 to EL4 may receive a predetermined alignment signal (or alignment voltage) transferred from a corresponding pad electrode before light emitting elements LD may be aligned in the emission area EMA of the pixel PXL, to be used as an alignment electrode (or alignment line) for aligning the light emitting elements LD.

Alignment signals (or alignment voltages) respectively transferred to the first to fourth electrodes EL1 to EL4 may be signals a voltage difference and/or a phase difference to a degree to which the light emitting elements LD can be aligned between the first to fourth electrodes EL1 to EL4. At least one alignment signal (or alignment voltage) among the alignment signals (or alignment voltages) respectively transferred to the first to fourth electrodes EL1 to EL4 may be an AC signal (or voltage), but the disclosure is not limited thereto.

In the emission area EMA of the pixel PXL, the first electrode EL1 and the second electrode EL2 along with a plurality of light emitting elements LD electrically connected in parallel therebetween may constitute a first serial stage (see 'SET1' shown in FIG. 4), and the third electrode EL3 and the fourth electrode EL4 along with a plurality of light emitting elements LD electrically connected in parallel therebetween may constitute a second serial stage (see 'SET2' shown in FIG. 4).

In an embodiment, first and second serial stages SET1 and SET2 may be disposed in the emission area EMA of the pixel PXL. The first and second serial stages SET1 and SET2 may constitute a light emitting unit EMU of a corresponding pixel PXL.

The first electrode EL1 included in the first serial stage SET1 may be an anode of the light emitting unit EMU, and the fourth electrode EL4 included in the second serial stage SET2 may be a cathode of the light emitting unit EMU.

Light emitting elements LD may be disposed on the first to fourth electrodes EL1 to EL4.

Each of the light emitting elements LD may be a light emitting diode having a subminiature size, for example, a size small to a degree of a nano scale to a micro scale, which may be fabricated by using a material having an inorganic crystalline structure. Each of the light emitting elements LD may be a subminiature light emitting diode fabricated through an etching process or a subminiature light emitting diode fabricated through a growth process. A width of the light emitting elements LD in the third direction DR3 (for example, a thickness direction) may be smaller or less than a length of the light emitting elements LD in the first direction DR1.

At least two light emitting elements LD to a few tens of light emitting elements LD may be aligned and/or provided or disposed in the emission area EMA of the pixel PXL, but a number of the light emitting elements LD is not limited thereto. In an embodiment, the number of the light emitting elements LD aligned and/or provided or disposed in the emission area EMA may be variously changed.

Each of the light emitting elements LD may emit any one of colored light and/or white light. In an embodiment, each of the light emitting elements LD may emit light of a first color. The light of the first color may be blue light in a short wavelength band.

Each of the light emitting elements LD may be aligned between two adjacent electrodes among the first to fourth electrodes EL1 to EL4 such that an extending direction (or length L direction) is parallel to the first direction DR1, when viewed in a plan view and a section. The light emitting elements LD may be provided in a form in which the light emitting elements LD may be sprayed in a solution, to be input to the pixel area PXA of each pixel PXL.

The light emitting elements LD may be input to the pixel area PXA of each pixel PXL through an inkjet printing process, a slit coating process, or various processes. In an example, the light emitting elements LD may be mixed with a volatile solvent, to be input to the pixel area PXA through an inkjet printing process or a slit coating process. In a case that a corresponding alignment signal may be applied to each of the first to fourth electrodes EL1 to EL4 provided or disposed in the pixel area PXA, an electric field may be formed between two adjacent electrodes among the first to fourth electrodes EL1 to EL4. Therefore, the light emitting elements LD may be aligned between the two adjacent electrodes among the first to fourth electrodes EL1 to EL4.

After the light emitting elements LD may be aligned, the solvent may be volatilized or be removed through another process, so that the light emitting elements LD can be finally aligned and/or provided or disposed in the pixel area PXA of each pixel PXL.

Although it is illustrated that light emitting elements LD of which a length (see 'L' shown in FIG. 1) direction is parallel to the first direction DR1 may be aligned between two adjacent electrodes among the first to fourth electrodes EL1 to EL4, the disclosure is not limited thereto. In an embodiment, some or a number of the light emitting elements LD may be aligned between two adjacent electrodes such that the length L direction may be parallel to the second direction DR2 and/or a direction oblique to the second direction DR2. Also, in an embodiment, at least one reverse light emitting element (see 'LDr' shown in FIG. 4) electrically connected in a reverse direction between two adjacent electrodes may be further disposed.

In an embodiment, the light emitting elements LD may include a plurality of first light emitting elements LD1 and a plurality of second light emitting elements LD2.

The first light emitting elements LD1 may be disposed between the first electrode EL1 and the second electrodes EL2. The second light emitting elements LD2 may be disposed between the third electrode EL3 and the fourth electrodes EL4.

The first light emitting elements LD1 may be aligned in the same direction between the first electrode EL1 and the second electrode EL2. In an example, one or an end portion of each of the first light emitting elements LD1 may be electrically connected to the first electrode EL1, and the other or another end of each of the first light emitting elements LD1 may be electrically connected to the second electrode EL2. The first electrode EL1 and the second electrode EL2 along the first light emitting elements LD1 electrically connected in parallel in the same direction therebetween may constitute a first serial stage SET1.

The second light emitting elements LD2 may be aligned in the same direction between the third electrode EL3 and the fourth electrode EL4. In an example, one or an end portion of each of the second light emitting elements LD2 may be electrically connected to the third electrode EL3, and the other or another end portion of each of the second light emitting elements LD2 may be electrically connected to the fourth electrode EL4. The third electrode EL3 and the fourth electrode EL4 along with the second light emitting elements LD2 electrically connected in parallel in the same direction therebetween may constitute a second serial stage SET2.

In an embodiment, the first light emitting element LD1 may be disposed to overlap a first side S_EL1 (or end portion) of the first electrode EL1 and a second side S_EL2 (or end portion) of the second electrode EL2, which face each other, in the third direction DR3 (for example, the thickness direction of the substrate SUB) between the first electrode EL1 and the second electrode EL2.

In an embodiment, a distance between the first side S_EL1 of the first electrode EL1 and the second side S_EL2 of the second electrode EL2 (for example, a distance between the first electrode EL1 and the second electrode EL2) may be smaller or less than a length (see 1' shown in FIG. 1) of the first light emitting element LD1. For example, the length L of the first light emitting element LD1 may be about 3 μm, the distance between the first side S_EL1 of the first electrode EL1 and the second side S_EL2 of the second electrode EL2 may be about 2 μm. The distance between the first side S_EL1 of the first electrode EL1 and the second side S_EL2 of the second electrode EL2 may be smaller or less by about 1 μm than the length L of the first light emitting element LD1.

The first and second contact electrodes CNE1 and CNE2 and the intermediate electrode CTE may be provided or disposed and/or formed on the first to fourth electrodes EL1 to EL4.

The first and second contact electrodes CNE1 and CNE2 and the intermediate electrode CTE may be components which more stably connect the light emitting elements LD electrically to the first to fourth electrodes EL1 to EL4.

The first contact electrode CNE1 may be provided or disposed and/or formed on the first electrode EL1. The first contact electrode CNE1 may be electrically and/or physically connected to the first electrode EL1 by being in direct contact with the first electrode EL1. Also, the first contact electrode CNE1 may be provided or disposed and/or formed on one or an end portion EP1 of each of the first light emitting elements LD1 to be electrically and/or physically connected to the one or an end portion EP1 of each of the first light emitting elements LD1. Accordingly, the first electrode EL1 and the one or an end portion EP1 of each of the first light emitting elements LD1 may be electrically connected to each other through the first contact electrode CNE1.

The second contact electrode CNE2 may be provided or disposed and/or formed on the fourth electrode EL4. The second contact electrode CNE2 may be electrically and/or physically connected to the fourth electrode EL4 by being in contact with the fourth electrode EL4. Also, the second contact electrode CNE2 may be electrically and/or physically connected to the other end portion of each of the second light emitting elements LD2. Accordingly, the fourth electrode EL4 and the other end portion of each of the second light emitting elements LD2 may be electrically connected to each other through the second contact electrode CNE2.

The first and second contact electrodes CNE1 and CNE2 may be made of various transparent conductive materials so as to allow light emitted from each of the light emitting elements LD to advance in the image display direction (for example, the third direction DR3) of the display device without loss of light. In an example, the first and second contact electrodes CNE1 and CNE2 may include at least one of various transparent conductive materials (or substances) including indium tin oxide (ITO), indium zinc oxide (IZO), zinc oxide (ZnO), indium gallium zinc oxide (IGZO), and indium tin zinc oxide (ITZO), and be substantially transparent or translucent to satisfy a predetermined transmittance (or transmittancy). However, the material of the first and second contact electrodes CNE1 and CNE2 is not limited to the above-described embodiment. In an embodiment, the first and second contact electrodes CNE1 and CNE2 may be made of various opaque conductive materials (or substances). The first and second contact electrodes CNE1 and CNE2 may be formed as a single layer or a multi-layer.

The first intermediate electrode CTE may include a first intermediate electrode CTE1 and a second intermediate electrode CTE2, which extend in the second direction DR2.

The first intermediate electrode CTE1 may be provided or disposed on the second electrode EL2, and overlap the second electrode EL2 when viewed in a plan view. The first intermediate electrode CTE1 may be electrically and/or physically connected to the second electrode EL2 by being in direct contact with the second electrode EL2. Also, the first intermediate electrode CTE1 may be provided or disposed and/or formed on the other end portion EP2 of each of the first light emitting elements LD1 to be electrically and/or physically connected to the other end portion EP2 of each of the first light emitting elements LD1. Accordingly, the second electrode EL2 and the other end portion of each of the first light emitting elements LD1 may be electrically connected to each other through the first intermediate electrode CTE1.

However, the disclosure is not limited thereto. For example, in a case that a separate insulating layer is disposed between the first intermediate electrode CTE1 and the second electrode EL2, the first intermediate electrode CTE1 may be electrically insulated from the second electrode EL2.

The second intermediate electrode CTE2 may be provided or disposed on the third electrode EL3, and overlap the third electrode EL3 when viewed in a plan view. The second intermediate electrode CTE2 may be electrically and/or physically connected to the third electrode EL3 by being in direct contact with the third electrode EL3. Also, the second intermediate electrode CTE2 may be provided or disposed and/or formed on the one or an end portion of each of the second light emitting elements LD2 to be electrically and/or physically connected to the other or another end portion of each of the second light emitting elements LD2. Accordingly, the third electrode EL3 and the one or an end portion of each of the second light emitting elements LD2 may be electrically connected to each other through the second intermediate electrode CTE2.

However, the disclosure is not limited thereto. For example, in a case that a separate insulating layer is disposed between the second intermediate electrode CTE2 and the third electrode EL3, the second intermediate electrode CTE2 may be electrically insulated from the third electrode EL3.

In an embodiment, when viewed in a plan view, the first contact electrode CNE1, the first and second intermediate electrodes CTE1 and CTE2, and the second contact electrode CNE2 may respectively have substantially the same shapes as the first to fourth electrodes EL1 to EL4. Although as will be described later with reference to FIGS. 13 to 19, as the first to fourth electrodes EL1 to EL4 may be formed by using a mask, planar shapes of the first contact electrode CNE1, the first and second intermediate electrodes CTE1 and CTE2, and the second contact electrode CNE2 may be substantially identical to those of the first to fourth electrodes Ell to EL4, respectively. Also, the first contact electrode CNE1, the first and second intermediate electrodes CTE1 and CTE2, and the second contact electrode CNE2 may completely overlap the first to fourth electrodes EL1 to EL4, respectively. For example, the first contact electrode CNE1, the first and second intermediate electrodes CTE1 and CTE2, and the second contact electrode CNE2 may be aligned on the first to fourth electrodes EL1 to EL4.

In an embodiment, the first intermediate electrode CTE1 and the second intermediate electrode CTE2 may be integral with each other to be electrically connected to each other. The first intermediate electrode CTE1 and the second intermediate electrode CTE2 may be different regions of the intermediate electrode CTE. The first intermediate electrode CTE1 may be the same component as the first intermediate electrode CTE1 described with reference to FIG. 4, and the second intermediate electrode CTE2 may be the same component as the second intermediate electrode CTE2 described with reference to FIG. 4. The intermediate electrode CTE may serve as a bridge electrode (or connection electrode) electrically connecting the other end portion EP2 of each of the first light emitting elements LD1 and the one or an end portion of each of the second light emitting elements LD2. For example, the intermediate electrode CTE may be a bridge electrode (or connection electrode) electrically connecting the first serial stage SET1 and the second serial stage SET2.

The first contact electrode CNE1, the second contact electrode CNE2, and the intermediate electrode CTE may be disposed to be spaced apart from each other in a plan view and a section.

The first contact electrode CNE1 may face one or a region of the intermediate electrode CTE, for example, the first intermediate electrode CTE1. The first contact electrode CNE1 and the first intermediate electrode CTE1 may extend in the same direction, for example, the second direction DR2. The first contact electrode CNE1 and the first intermediate electrode CTE1 may be spaced apart from each other in the first direction DR1. The second contact electrode CNE2 may face another region of the intermediate electrode CTE, for example, the second intermediate electrode CTE2. The second contact electrode CNE2 and the second intermediate electrode CTE2 may extend in the second direction DR2. The second contact electrode CNE2 and the second intermediate electrode CTE2 may be spaced apart from each other in the second direction DR2.

The intermediate electrode CTE may be made of various transparent conductive materials (or substances) so as to allow light emitted from each of the light emitting elements LD to advance in the image display direction of the display device without loss of light.

The intermediate electrode CTE may be provided or disposed in the same layer as the first and second contact electrodes CNE1 and CNE2 to be formed through the same process as the first and second contact electrodes CNE1 and CNE2.

The first and second contact electrodes CNE1 and CNE2 and the intermediate electrode CTE may be located or disposed to correspond to the second area A2, for example, the emission area EMA of the pixel PXL. By way of example, the first and second contact electrodes CNE1 and CNE2 and the intermediate electrode CTE may be provided or disposed in the second opening OP2 of the bank BNK.

In an embodiment, a third side S_CNE1 (or third side surface) of the first contact electrode CNE1 and the first side S_EL1 of the first electrode EL1 may be located or disposed on a first virtual line L_V1 (or first virtual surface) substantially perpendicular to the substrate SUB, and a fourth side S_CTE1 (or fourth side surface) of the first intermediate electrode CTE1 and the second side S_EL2 (or second side surface) of the second electrode EL2 may be located or disposed on a second virtual line L_V2 (or second virtual surface) substantially perpendicular to the substrate SUB.

In an embodiment, a distance between the first contact electrode CNE1 and the first intermediate electrode CTE1 may be equal to that between the first electrode EL1 and the second electrode EL2. In a plan view (or on a section), the third side S_CNE1 of the first contact electrode CNE1 may accord with the first side S_EL1 of the first electrode EL1, and the fourth side S_CTE1 of the first intermediate electrode CTE1 may accord with the second side S_EL2 of the second electrode EL2.

Although will be described later with reference to FIGS. 13 to 19, as the first contact electrode CNE1 and the first intermediate electrode CTE1 may be formed by using a mask formed corresponding to the first and second electrodes EL1 and EL2 through back exposure (for example, exposure on the substrate SUB in the third direction DR3), the first contact electrode CNE1 may be aligned with respect to the first electrode EL1, and the first intermediate electrode CTE1 may be aligned with respect to the second electrode EL2. Similarly, as the second intermediate electrode CTE2 and the second contact electrode CNE2 may be formed by using a mask corresponding to the third and fourth electrodes EL3 and EL4, the second intermediate electrode CTE2 may be aligned with respect to the third electrode EL3, and the second contact electrode CNE2 may be aligned with respect to the fourth electrode EL4.

In an embodiment, for the purpose of back exposure, in a plan view, any opaque conductive material may not be disposed between the first contact electrode CNE1 and the first intermediate electrode CTE1, except the first light emitting elements LD1. Similarly, in a plan view, any opaque conductive material may not be disposed between the second intermediate electrode CTE2 and the second contact electrode CNE2, except the second light emitting elements LD2. As shown in FIGS. 5 and 6, conductive materials constituting the pixel circuit layer PCL may be provided or disposed in the first area A1, and may not be provided or disposed in the second area A2 (for example, the emission area EMA).

In an embodiment, in a plan view, an opaque conductive material may be disposed between the first intermediate electrode CTE1 and the second intermediate electrode CTE2, which extend in the second direction DR2 so as to form a connection pattern electrically connecting the first intermediate electrode CTE1 and the second intermediate electrode CTE2 between the first intermediate electrode CTE1 and the second intermediate electrode CTE2 (for example, a connection pattern integral with the first and second intermediate electrodes CTE1 and CTE2).

In an embodiment, a supporting member PW (or wall) may be located or disposed under or below the first and second contact electrodes CNE1 and CNE2 and the intermediate electrode CTE (or under or below the first to fourth electrodes EL1 to EL4). In an example, as shown in FIG. 6, a first bank pattern PW1 may be disposed under or below the first contact electrode CNE1, and a second bank pattern PW2 may be disposed under or below the first intermediate electrode CTE1.

The supporting member PW (for example, the first and second bank patterns PW1 and PW2) may be located or disposed in the emission area EMA of the pixel PXL. The supporting member PW may be a guide member which guides light emitted from the light emitting elements LD in the third direction DR3. By way of example, the supporting member PW may be a guide member which further guides light emitted from the light emitting elements LD in a desired direction by changing a surface profile (or shape) of each of the first and second contact electrodes CNE1 and CNE2 and the intermediate electrode CTE such that each of the first and second contact electrodes CNE1 and CNE2 and the intermediate electrode CTE has a shape substantially protruding in the third direction DR3 by supporting at least a portion of each of first and second contact electrodes CNE1 and CNE2 and the intermediate electrode CTE.

The supporting member PW (for example, the first and second bank patterns PW1 and PW2) may be an inorganic insulating layer including an inorganic material or an organic insulating layer including an organic material. In an embodiment, the supporting member PW may include a single-layered organic insulating layer and/or a single-layered inorganic insulating layer, but the disclosure is not limited thereto. In an embodiment, the supporting member PW may be provided in the form of a multi-layer in which at least one organic insulating layer and at least one inorganic insulating layer may be stacked each other. However, the material of the supporting member PW is not limited to the above-described embodiment. In an embodiment, the supporting member PW may include a conductive material. In an embodiment, the supporting member PW may include a transparent material (or substance). The transparent material may include polyamides resin, polyimides resin, for example, but the disclosure is not limited thereto.

The supporting member PW (for example, the first and second bank patterns PW1 and PW2) may have a substantially trapezoidal shape having a width narrowed as approaching the top along the third direction DR3, but the disclosure is not limited thereto. In an embodiment, the supporting member PW may include a substantially curved surface having a section substantially of a semi-elliptical shape, a semicircular shape (or hemispherical shape), or the like, which may have a width narrowed as approaching the top along the third direction DR3. When viewed on a section, the shape of the supporting member PW is not limited to the above-described embodiments, and may be variously modified in a range in which the efficiency of light emitted from each of the light emitting elements LD can be improved.

In an embodiment, a color conversion layer may be provided or disposed and/or formed on the first and second contact electrodes CNE1 and CNE2 and the intermediate electrode CTE.

The color conversion layer may include color conversion particles corresponding to a specific or predetermined color. The color conversion layer may include color conversion particles for converting light of a first color, which is emitted from the light emitting elements LD disposed in the pixel PXL, into light of a second color (or specific or predetermined color). In an example, in a case that the pixel PXL is a red pixel, the color conversion layer may include color conversion particles including a red quantum dot for converting light emitted from the light emitting elements LD into red light. In another example, in a case that the pixel PXL is a green pixel, the color conversion layer may include color conversion particles including a green quantum dot for converting light emitted from the light emitting elements LD into green light. In another example, in a case that the pixel PXL is a blue pixel, the color conversion layer may include color conversion particles including a blue quantum dot for converting light emitted from the light emitting elements LD into blue light.

A passivation layer PASSI may be provided or disposed and/or formed over the first and second contact electrodes CNE1 and CNE2 and the intermediate electrode CTE. The passivation layer PASSI may be an inorganic insulating layer including an inorganic material or an organic insulating layer including an organic material. In an example, the passivation layer PASSI may have a structure in which at least one inorganic insulating layer and at least one organic insulating layer may be alternately stacked each other. As shown in FIG. 6, the passivation layer PASSI may entirely cover or overlap the first contact electrode CNE1, the first intermediate electrode CTE1, and the first light emitting element LD1, to block external moisture or humidity from being introduced to the inside of the first contact electrode CNE1, the first intermediate electrode CTE1, and the first light emitting element LD1, which may be disposed under or below the passivation layer PASSI.

In a case that an empty gap (or space) exists on the bottom of (or under or below) the light emitting elements LD between the first and second electrodes EL1 and EL2 before the passivation layer PASSI is formed, the empty gap may be filled with the passivation layer PASSI in a process of forming the passivation layer PASSI. Accordingly, the passivation layer PASSI may include an organic insulating layer advantageous in filling an empty gap existing on the bottom of the light emitting elements LD between the first and second electrodes EL1 and EL2.

In an embodiment, a color filter may be provided or disposed in the emission area EMA of the pixel PXL. The color filter may be provided or disposed on the passivation layer PASSI. However, the disclosure is not limited thereto, and the color filter may be formed together with the pixel circuit layer PCL to be provided or disposed on the bottom of the first and second electrodes EL1 and EL2.

The color filter may allow light emitted from the color conversion layer (for example, light converted into a specific or predetermined color) to be selectively transmitted therethrough. The color filter may include a red color filter, a green color filter, and a blue color filter.

In a case that a driving current flows from the first power line PL1 to the second power line PL2 via the pixel circuit PXC of the pixel PXL by the first transistor T1 included in the pixel circuit PXC, the driving current may be introduced to the first electrode EL1 through the first transistor T1 and the upper electrode UE. The driving current flows in the intermediate electrode CTE via the first light emitting element LD1 through the first contact electrode CNE1 in direct electrical contact with (or electrically connected to) the first electrode EL1. Accordingly, the first light emitting elements LD1 in the first serial stage SET1 may emit light with a luminance corresponding to a current divided and applied thereto. The driving current flowing in the intermediate electrode CTE flows in the second contact electrode CNE2 via the intermediate electrode CTE and the second light emitting elements LD. Accordingly, the second light emitting elements LD2 in the second serial stages SET2 may emit light with a luminance corresponding to a current divided and applied thereto.

As described above, the pixel circuit layer PCL may be provided or disposed in the first area A1 of the substrate SUB, and the display element layer DPL may be disposed in the second area A2 of the substrate SUB. In a plan view, the opaque conductive material of the pixel circuit layer PCL may not be disposed in the second area A2 (or the emission area EMA). Therefore, the first and second contact electrodes CNE1 and CNE2 and the intermediate electrode CTE of the display element layer DPL may be formed through a back exposure process using the first to fourth electrodes EL1 to EL4 as a mask. The first and second contact electrodes CNE1 and CNE2 and the intermediate electrode CTE may be self-aligned with respect to the first to fourth electrodes EL1 to EL4. For example, it is unnecessary to separately align the first and second contact electrodes CNE1 and CNE2 and the intermediate electrode CTE (or a mask for forming the same) with respect to the first to forming electrodes EL1 to EL4, and any alignment error of the first and second contact electrodes CNE1 and CNE2 and the intermediate electrode CTE with respect to the first to fourth electrodes EL1 to EL4 and any contact failure caused by the alignment error may not occur.

Although a case where the first contact electrode CNE1 completely overlaps the first electrode EL1 and the first intermediate electrode CTE completely overlaps the second electrode EL2 has been illustrated in FIG. 6, the disclosure is not limited thereto. Also, although a case where the first light emitting element LD1 is directly disposed on the first and second electrodes EL1 and EL2 has been illustrated in FIG. 6, the disclosure is not limited thereto.

FIGS. 7 to 12 are schematic cross-sectional views illustrating various embodiments of the pixel taken along the line I-I' shown in FIG. 5. Views corresponding to FIG. 6 are illustrated in FIGS. 7 to 12.

Figure 7:
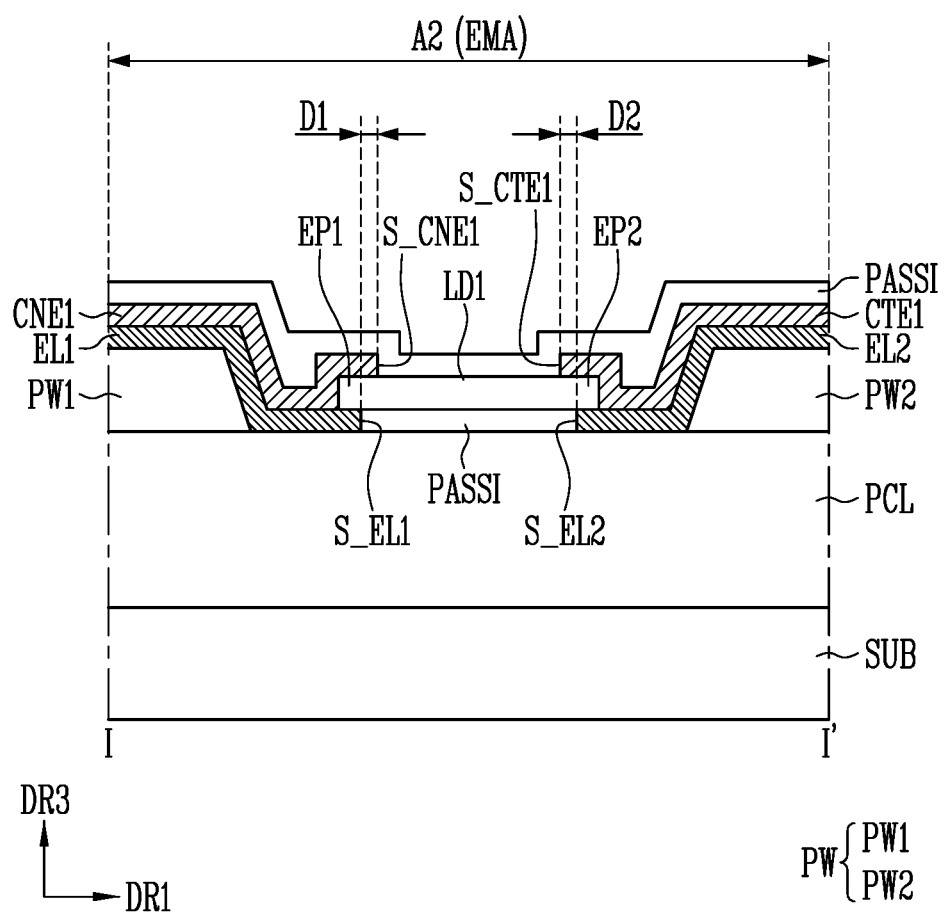
FIGS. 7 to 12 are schematic cross-sectional views illustrating various embodiments of the pixel taken along the line I-I' shown in FIG. 5.

First, referring to FIGS. 6 and 7, the first contact electrode CNE1 may further protrude toward the second electrode EL2 (or the first intermediate electrode CTE1) than the first electrode ELL and the first intermediate electrode CTE1 may further protrude toward the first electrode EL1 (or the first contact electrode CNE1) than the second electrode EL2. In other words, a distance between the first contact electrode CNE1 and the first intermediate electrode CTE1 may be smaller or less than that between the first electrode EL1 and the second electrode EL2. Although will be described later with reference to FIGS. 13 to 19, the distance between the first contact electrode CNE1 and the first intermediate electrode CTE1 may become smaller or less than that between the first electrode EL1 and the second electrode EL2 by a sectional shape of a mask formed through back exposure and/or an etch rate of the first contact electrode CNE1 and the first intermediate electrode CTE1 (for example, a difference between an etch rate of the first contact electrode CNE1 and the first intermediate electrode CTE1 and an etch rate of the first and second electrodes EL1 and EL2).

However, since the first contact electrode CNE1 and the first intermediate electrode CTE1 may be formed through the same process as the first electrode EL1 and the second electrode EL2 by using the first electrode EL1 and the second electrode EL2, a first distance D1 between the first contact electrode CNE1 and the first electrode EL1 (for example, a first distance D1 in the first direction DR1 between the third side S_CNE1 of the first contact electrode CNE1 and the first side S_EL1 of the first electrode EL1) may be equal to a second distance D2 between the first intermediate electrode CTE1 and the second electrode EL2 (for example, a second distance D2 in the first direction DR1 between the fourth side S_CTE1 of the first intermediate electrode CTE1 and the second side S_EL2 of the second electrode EL2). For example, each of the first distance D1 between the first contact electrode CNE1 and the first electrode EL1 and the second distance D2 between the first intermediate electrode CTE1 and the second electrode EL2 may be about 1 μm or less.

Figure 8:
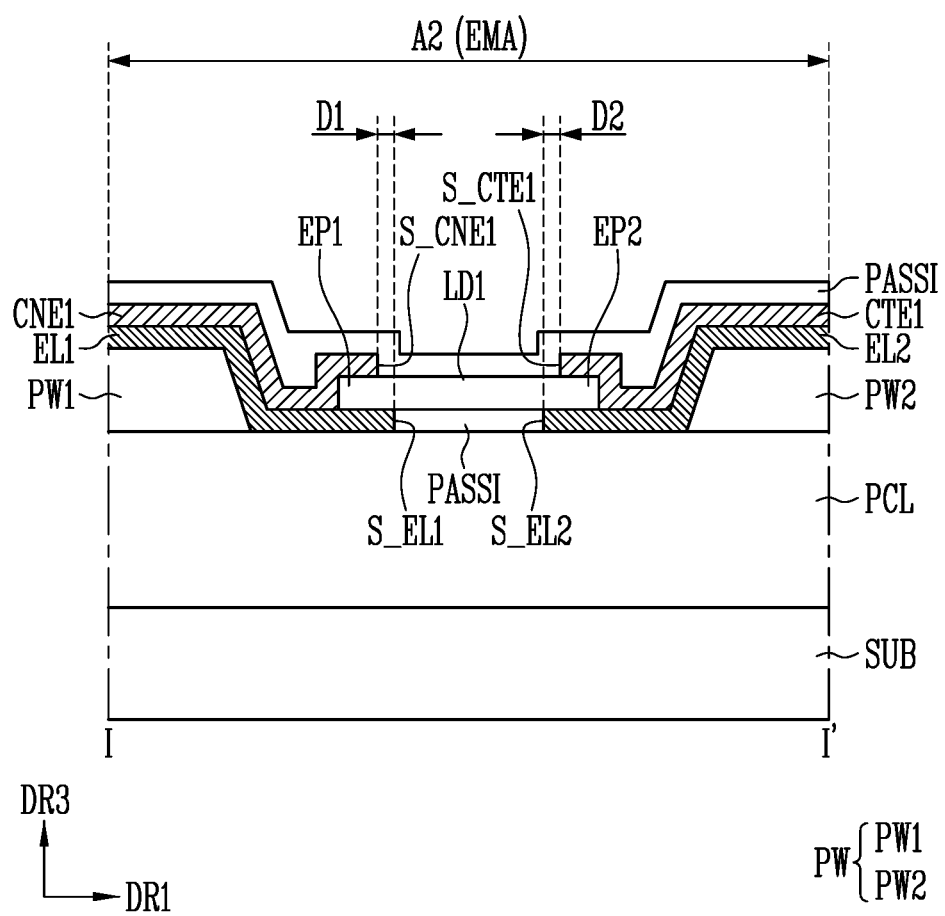

Alternatively, a distance between the first contact electrode CNE1 and the first intermediate electrode CTE1 may be greater than that between the first electrode EL1 and the second electrode EL2. As shown in FIG. 8, the first electrode EL1 may further protrude toward the second electrode EL2 than the first contact electrode CNE1, and the second electrode EL2 may further protrude toward the first electrode EL1 than the first intermediate electrode CTE1.

However, a first distance D1 between the first contact electrode CNE1 and the first electrode EL1 (for example, a first distance D1 in the first direction DR1 between the third side S_CNE1 of the first contact electrode CNE1 and the first side S_EL1 of the first electrode EL1) may be equal to a second distance D2 between the first intermediate electrode CTE1 and the second electrode EL2 (for example, a second distance D2 in the first direction DR1 between the fourth side S_CTE1 of the first intermediate electrode CTE1 and the second side S_EL2 of the second electrode EL2).

In an embodiment, a first insulating layer INS1 may be disposed between the first light emitting element LD1 and the first and second electrode EL1 and EL2 (or between the light emitting elements LD and the first to fourth electrodes EL1 to EL4 (see FIG. 5)).

Figure 9:
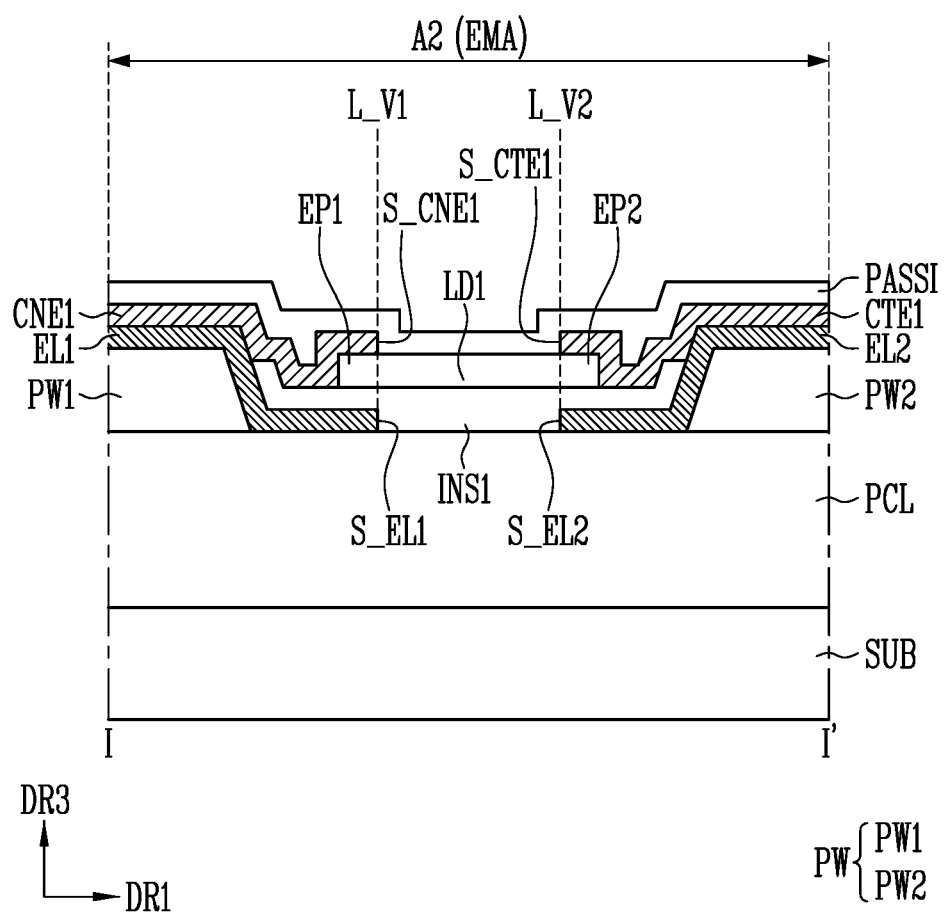

Referring to FIGS. 5 and 9, the first insulating layer INS1 may be provided or disposed and/or formed on the first and second electrodes EL1 and EL2 (or the first to fourth electrodes EL1 to EL4 (see FIG. 5)).

The first insulating layer INS1 may be provided or disposed and/or formed on the substrate SUB (or a layer corresponding to the pixel circuit layer PCL) to entirely cover or overlap the first to fourth electrodes EL1 to EL4. After light emitting elements LD may be supplied and aligned on the first insulating layer INS1, the first insulating layer INS1 may be partially opened to expose one or a region of each of the first to fourth electrodes EL1 to EL4. As shown in FIG. 9, the first insulating layer INS1 may be opened to expose a portion of each of the first and second electrodes EL1 and EL2 overlapping the first and second bank patterns PW1 and PW2. Alternatively, the first insulating layer INS1 may be patterned in the form of an individual pattern locally disposed on the bottom of the light emitting elements LD. In an embodiment, the first insulating layer INS1 may cover or overlap the other regions except one or a region of each of the first and fourth electrodes EL1 and EL4 (for example, the second electrode EL2 and the third electrode EL3) in the second area A2 (see FIG. 5). In an embodiment, like the embodiment shown in FIG. 6, the first insulating layer INS1 may be omitted.

In an embodiment, a second insulating layer INS2 (insulating pattern, or anchor) may be provided or disposed and/or formed on the light emitting elements LD.

Figure 10:
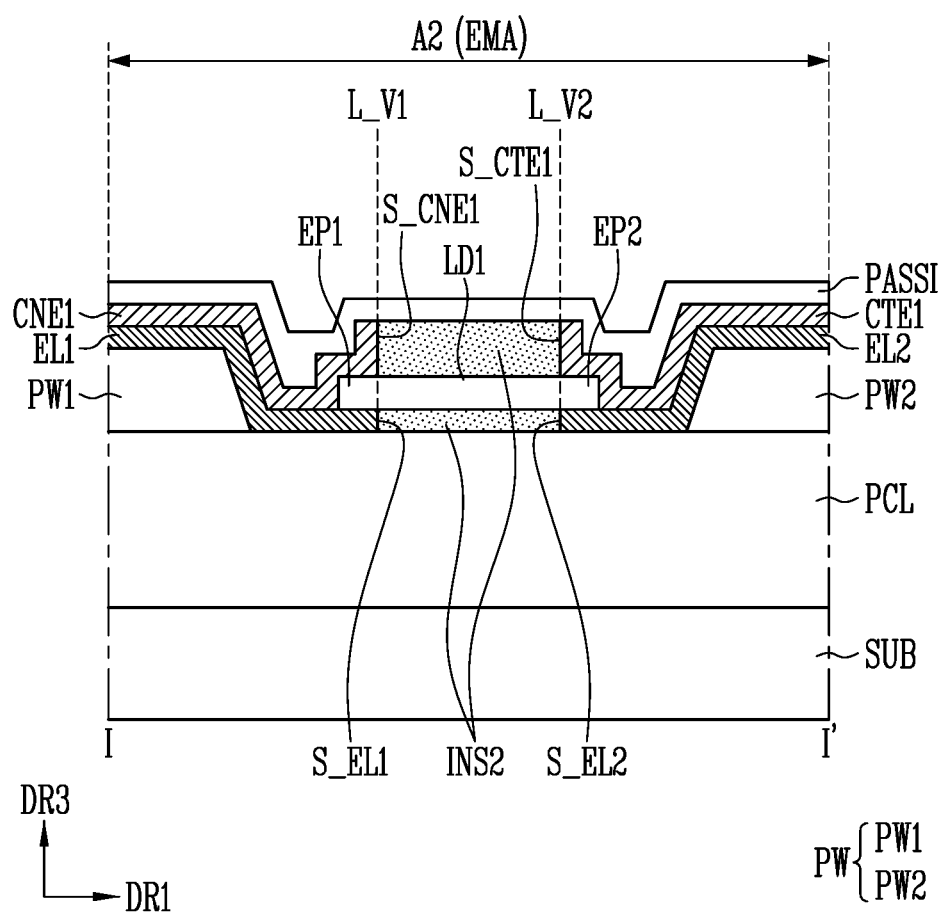

Referring to FIGS. 5 and 10, the second insulating layer INS2 may be provided or disposed and/or formed on the first light emitting element LD1 between the first and second electrodes EL1 and EL2.

The second insulating layer INS2 may be provided or disposed and/or formed on the first light emitting element LD1 (or the light emitting elements LD) to partially cover or overlap an outer circumferential surface (or surface) of the first light emitting element LD1, and expose both end portions (for example, one or an end portion EP1 and the other or another end portion EP2) of the first light emitting element LD1 to the outside.

The second insulating layer INS2 may be configured or formed as a single layer or a multi-layer, and include an inorganic insulating layer made including at least one inorganic material or an organic insulating layer including at least one organic material. The second insulating layer INS2 may further fix the first light emitting element LD1 (or each of the light emitting elements LD). The second insulating layer INS2 may include an inorganic insulating layer advantageous in protecting an active layer 12 (see FIGS. 1 and 2) the first light emitting element LD1 (or each of the light emitting elements LD) from external oxygen, moisture, and the like within the spirit and the scope of the disclosure. However, the disclosure is not limited thereto. The second insulating layer INS2 may be configured or formed as an organic insulating layer including an organic material according to a design condition of the display device in which the above-described light emitting elements LD may be applied as a light source.

After light emitting elements LD are completely aligned in the pixel area PXA of the pixel PXL, the second insulating layer INS2 may be formed on the light emitting elements LD, so that the light emitting elements LD can be prevented from being separated from positions at which the light emitting elements LD may be aligned. In a case that an empty gap (or space) between the light emitting elements LD exists between the first and second electrodes EL1 and EL2 (and between the third and fourth electrodes EL3 and EL4) before the second insulating layer INS2 is formed, the empty gap may be filled with the second insulating layer INS2 in a process of forming the second insulating layer INS2. Accordingly, the second insulating layer INS2 may be configured or formed as an organic insulating layer advantageous in filling the empty gap.

In an embodiment, the first contact electrode CNE1 may be in contact with a first side surface of the second insulating layer INS2, the first intermediate electrode CTE1 may be in contact with a second side surface of the second insulating layer INS2, and the first contact electrode CNE1 and the first intermediate electrode CTE1 may not in contact with a top surface of the second insulating layer INS2. Although will be described later with reference to FIGS. 13 to 19, in addition to the first contact electrode CNE1 and the first intermediate electrode CTE1, the second insulating layer INS2 may be formed by using a mask corresponding to the first and second electrodes EL1 and EL2 (for example, the substantially same mask as the first and second electrodes EL1 and EL2). Therefore, the third side S_CNE1 of the first contact electrode CNE1 may be located or disposed on a first virtual line L_V1 which accords with or is the same as or coincides with the first side surface of the second insulating layer INS2, and the fourth side S_CTE1 of the first intermediate electrode CTE1 may be located or disposed on a second virtual line L_V2 which accords with or is the same as or coincides with the second side surface of the second insulating layer INS2. Accordingly, the first contact electrode CNE1 and the first intermediate electrode CTE1 may be formed up to a height substantially equal to that of the top surface of the second insulating layer INS2 with respect to the substrate SUB. The first contact electrode CNE1 may completely cover or overlap the first side surface of the second insulating layer INS2, and the first intermediate electrode CTE1 may completely cover or overlap the second side surface of the second insulating layer INS2.

Although a case where the second insulating layer INS2 has a substantially quadrangular cross-sectional shape has been illustrated in FIG. 10, the disclosure is not limited thereto.

Figure 11:
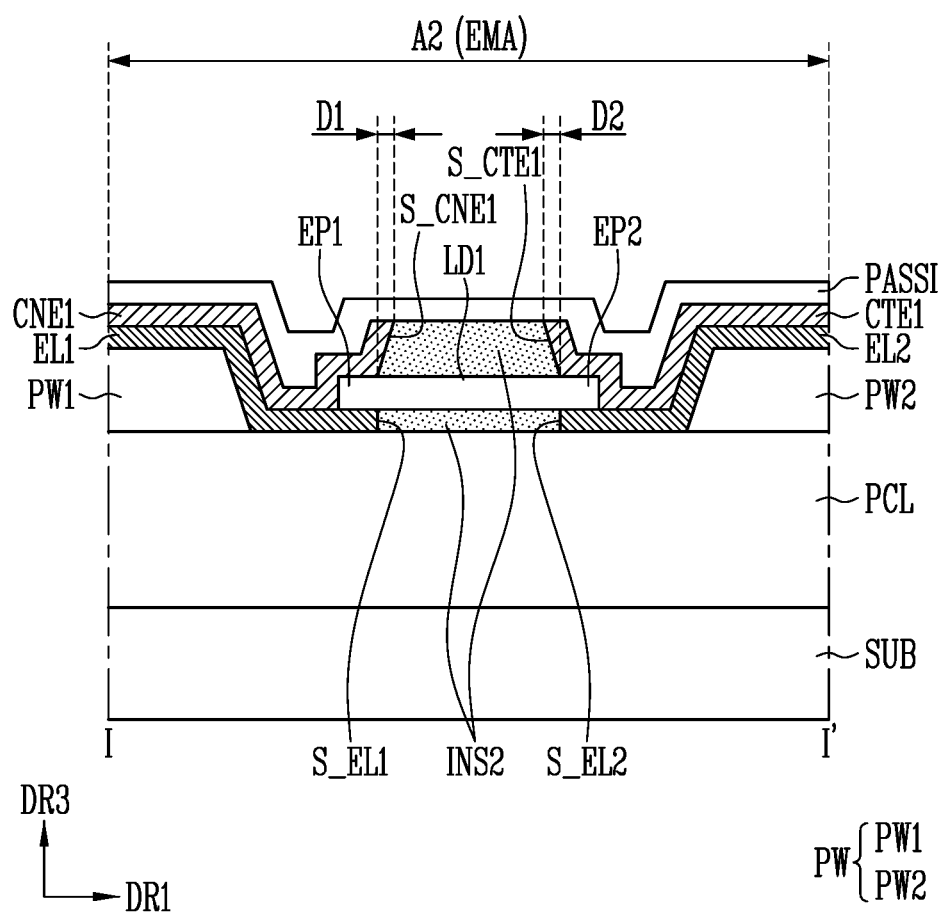

In an embodiment, as shown in FIG. 11, the second insulating layer INS2 may have a sectional shape substantially of a trapezoid. For example, a width of the second insulating layer INS2 may be narrowed as approaching the top of the second insulating layer INS2, and an area (or a width in the first direction DR1) of a bottom surface of the second insulating layer INS2 may be greater than that of the top surface of the second insulating layer INS2. With respect to the substrate SUB, an inclination angle (or taper angle) of the first side surface of the second insulating layer INS2 may be equal to that of the second side surface of the second insulating layer INS2.

As described with reference to FIG. 7, the first contact electrode CNE1 may further protrude toward the second electrode EL2 (or the first intermediate electrode CTE1)

than the first electrode EL1, and the first intermediate electrode CTE1 may further protrude toward the first electrode EL1 (or the first contact electrode CNE1) than the second electrode EL2. In other words, a distance between the first contact electrode CNE1 and the first intermediate electrode CTE1 may be smaller or less than that between the first electrode EL1 and the second electrode EL2. Also, as described with reference to FIG. 7, a first distance D1 between the first contact electrode CNE1 and the first electrode EL1 (for example, the first distance D1 in the first direction DR1 between the third side S_CNE1 of the first contact electrode CNE1 and the first side S_EL1 of the first electrode EL1) may be equal to the second distance D2 between the first intermediate electrode CTE1 and the second electrode EL2 (for example, the second distance D2 in the first direction DR1 between the fourth side S_CTE1 of the first intermediate electrode CTE1 and the second side S_EL2 of the second electrode EL2).

Figure 12:
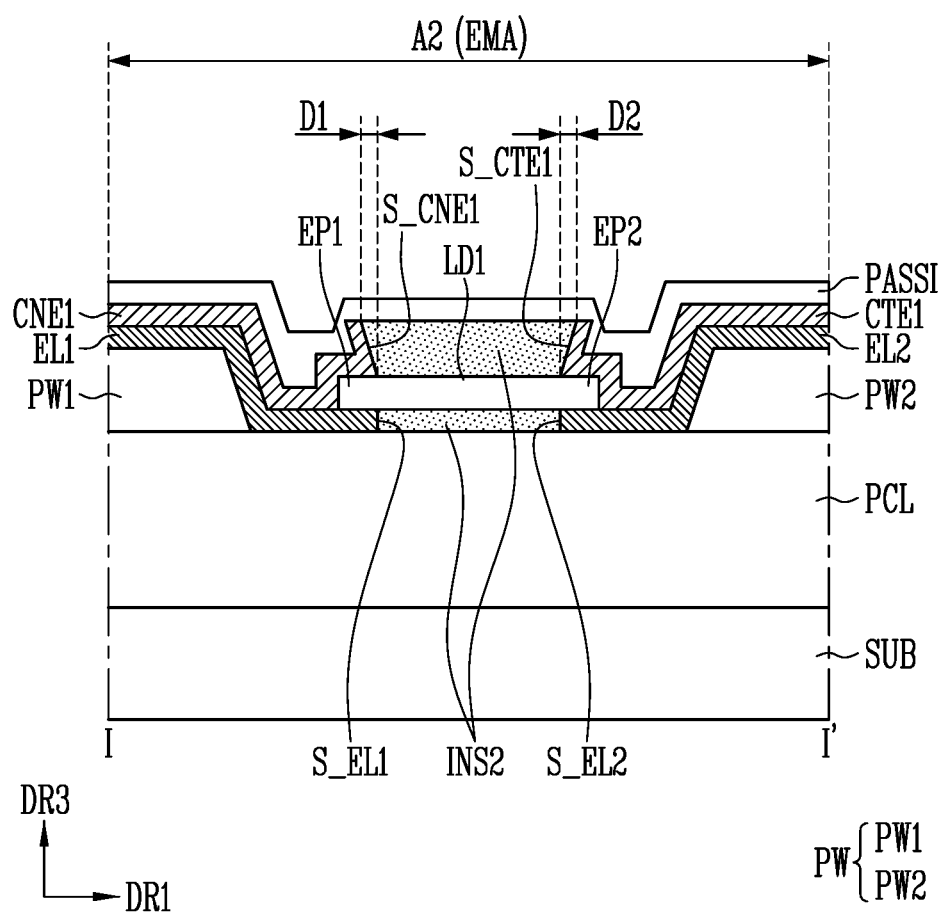
Figure 13:
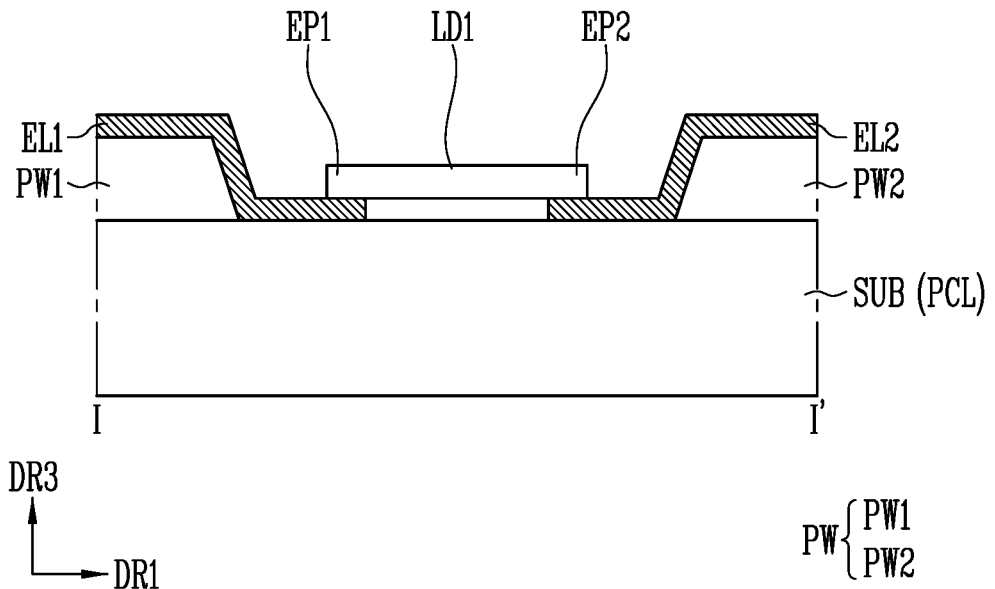
FIGS. 13 to 19 are schematic cross-sectional views illustrating a method of fabricating a display device in accordance with an embodiment.

In an embodiment, as shown in FIG. 12, the second insulating layer INS2 may have a reversed tapered sectional shape. For example, an area (or a width in the first direction DR1) of the top surface of the second insulating layer INS2 may be greater than that of the bottom surface of the second insulating layer INS2.

As described with reference to FIG. 8, the distance between the first contact electrode CNE1 and the first intermediate electrode CTE1 may be greater than that between the first electrode EL1 and the second electrode EL2. The first electrode EL1 may further protrude toward the second electrode EL2 than the first contact electrode CNE1, and the second electrode EL2 may further protrude toward the first electrode EL1 than the first intermediate electrode CTE1. For example, an inclination angle (or taper angle) of the first side surface of the second insulating layer INS2 may be equal to that of the second side surface of the second insulating layer INS2, and a first distance D1 between the first contact electrode CNE1 and the first electrode EL1 and a second distance between the first intermediate electrode CTE1 and the second electrode EL2 may be the same.

As described with reference to FIGS. 7 to 12, a distance between the first contact electrode CNE1 and the first intermediate electrode CTE1 may become greater or smaller or less than that between the first electrode EL1 and the second electrode EL2 by a sectional shape of a mask formed through back exposure and/or an etch rate of the first contact electrode CNE1 and the first intermediate electrode CTE1 (for example, a difference between an etch rate of the first contact electrode CNE1 and the first intermediate electrode CTE1 and an etch rate of the first and second electrodes EL1 and EL2). The first distance D1 between the first contact electrode CNE1 and the first electrode EL1 may be equal to the second distance D2 between the first intermediate electrode CTE1 and the second electrode EL2, and the first contact electrode CNE1 and the first intermediate electrode CTE1 may be aligned with respect to the first and second electrodes EL1 and EL2.

For example, in a case that the second insulating layer INS2 may be further provided or disposed or formed on the light emitting elements LD, the first contact electrode CNE1 and the first intermediate electrode CTE1 may be separated from each other with respect to the second insulating layer INS2. The first contact electrode CNE1 and the first intermediate electrode CTE1 may be aligned with respect to the second insulating layer INS2 in addition to the first and second electrodes EL1 and EL2.

Hereinafter, a method of fabricating a display device will be described with reference to FIGS. 13 to 19.

FIGS. 13 to 19 are schematic cross-sectional views illustrating a method of fabricating a display device in accordance with an embodiment. Views corresponding to FIG. 6 are illustrated in FIGS. 13 to 19. For convenience of description, based on a light emitting unit EMU (see FIG. 4) (or a display element layer DPL), a display device DD (see FIG. 3) (or a pixel PXL (see FIG. 5)) is briefly illustrated in FIGS. 13 to 19.

First, referring to FIGS. 3, 5, 6, and 13, a first electrode EL1 and a second electrode EL2, which may be spaced apart from each other in the first direction DR1, may be formed on a substrate SUB (or a layer corresponding to a pixel circuit layer PCL).

A first light emitting element LD1 may be aligned between the first electrode EL1 and the second electrode EL2, which face each other, to overlap the first electrode EL1 and the second electrode EL2 in the third direction DR3 (or a thickness direction of the substrate SUB).

As described above, the first light emitting element LD1 may be prepared in a form in which the first light emitting element LD is dispersed in a predetermined solution, to be supplied to an emission area EMA (see FIG. 5) of a pixel area PXA through an inkjet printing process, a slit coating process, or the like within the spirit and the scope of the disclosure. In a case that a predetermined voltage is applied between the first electrode EL1 and the second electrode EL2, the first light emitting element LD1 is self-aligned between the first electrode EL1 and the second electrode EL2, while an electric field is formed between the first electrode EL1 and the second electrode EL2. After the first light emitting element LD1 may be aligned, a solvent may be volatilized or removed through another process, so that the first light emitting element LD1 can be stably arranged or disposed between the first electrode EL1 and the second electrode EL2.

Figure 14:
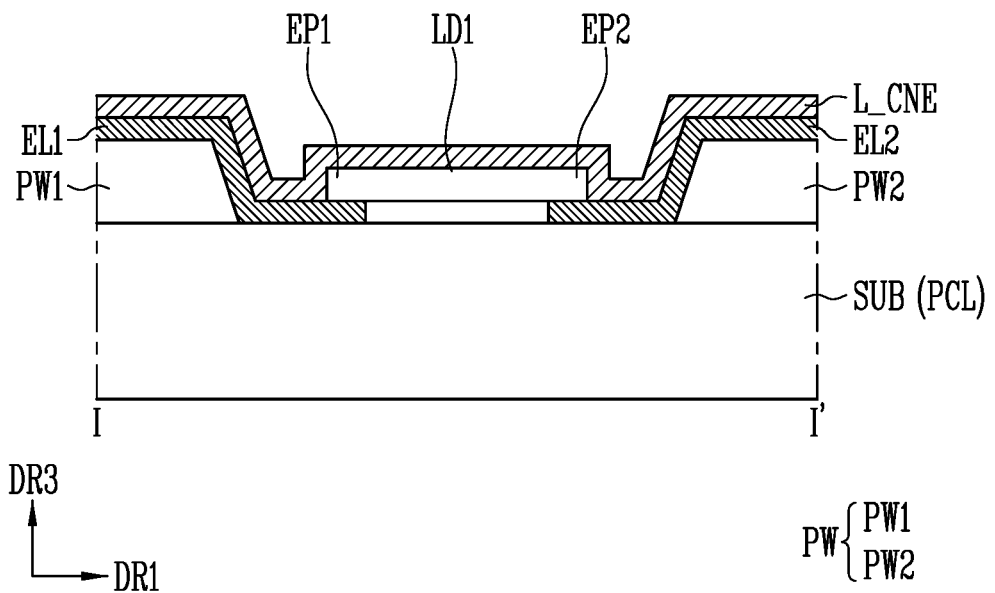

Subsequently, as shown in FIG. 14, an electrode layer L_CNE (or contact electrode layer) may be deposited or formed, which covers or overlaps the first electrode EL1, the second electrode EL2, and the first light emitting element LD1. The electrode layer L_CNE may be entirely formed on the substrate SUB.

In an embodiment, the electrode layer L_CNE may include a transparent conductive material (or substance). The transparent conductive material may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylenedioxythiophene) PEDOT, and the like within the spirit and the scope of the disclosure.

Figure 15:
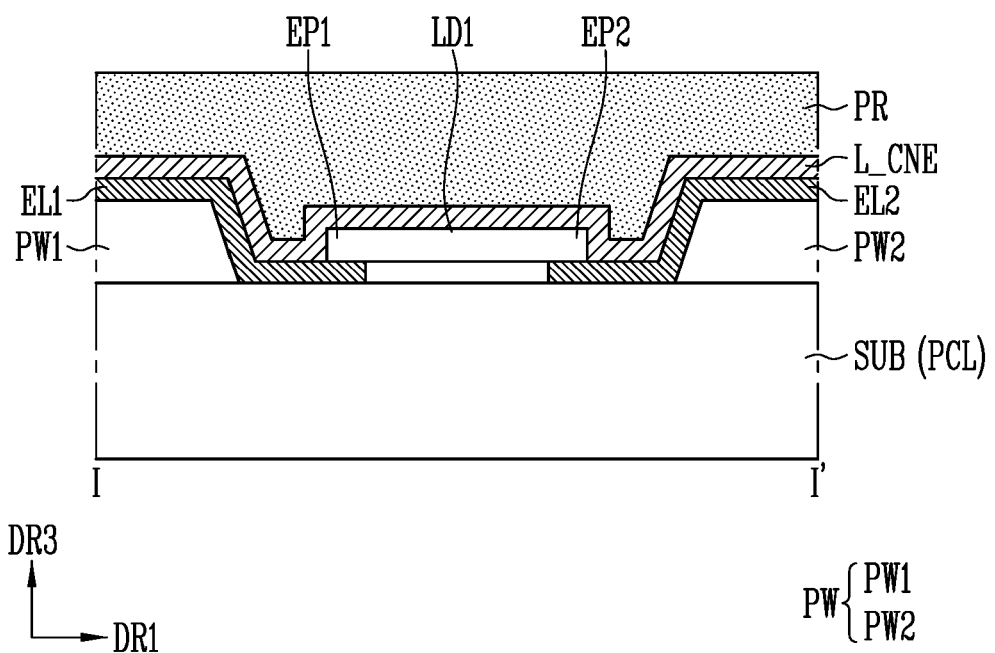

Subsequently, as shown in FIG. 15, a photoresist PR may be coated or formed on the electrode layer L_CNE. The photoresist PR may include a positive type photoresist composition, but the disclosure is not limited thereto.

Figure 16:
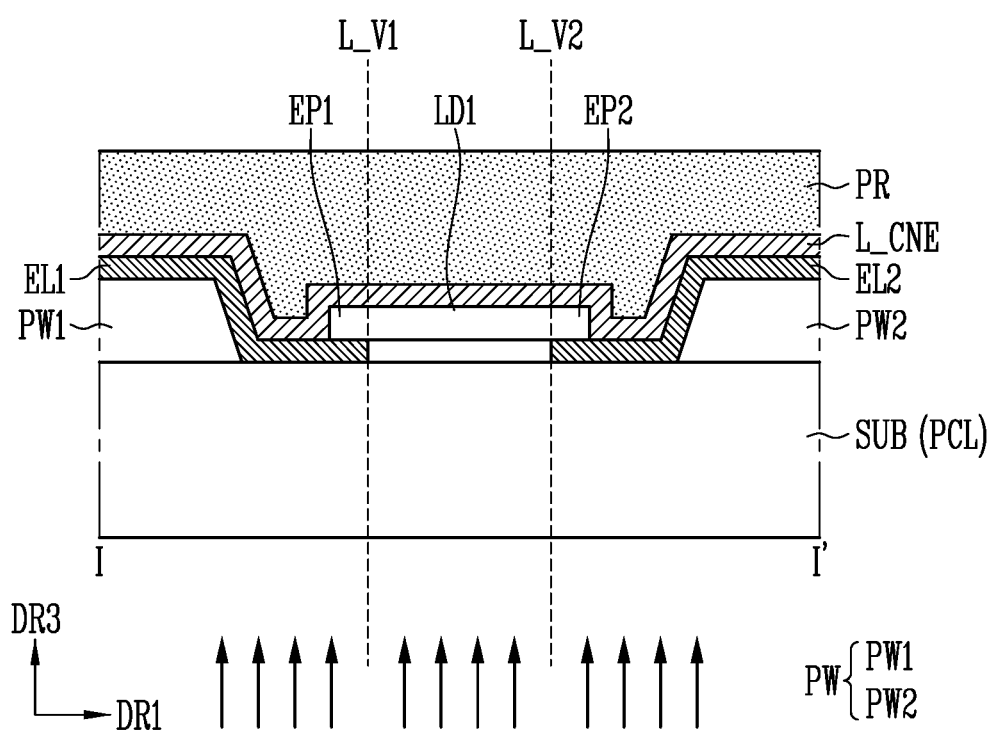

Subsequently, as shown in FIG. 16, light (for example, ultraviolet light) may be irradiated onto the substrate SUB in the third direction DR3.

As described with reference to FIG. 6, since the first and second electrodes EL1 and EL2 may include an opaque conductive material, and the opaque conductive material is not disposed between a first virtual line L_V1 and a second virtual line L_V2, light may be transmitted only between the first and second electrodes EL1 and EL2. For example, since the electrode layer L_CNE may be made of a transparent conductive material, the light transmitted between the first and second electrodes EL1 and EL2 may be irradiated onto the photoresist PR.

Although the first light emitting element LD1 (or light emitting elements LD (see FIG. 5)) is not made of any transparent material, since a width of the first light emitting element LD1 (for example, a thickness of the first light emitting element LD1 in the third direction DR3 in FIG. 16) may be a degree of a micro scale or a nano scale as described with reference with FIGS. 1 and 2, the light transmitted between the first and second electrodes EL1 and EL2 may advance while rotating around the first light emitting element LD1 (for example, being diffracted), to be irradiated on to the photoresist PR located or disposed between the first and second electrodes EL1 and EL2.

For example, back exposure may be performed on the substrate SUB (and the photoresist PR) by using the first and second electrodes EL1 and EL2 as a mask.

Since the photoresist PR may include a positive type photoresist composition, a portion of the photoresist PR onto which the light is irradiated may be solubilized. For example, the photoresist PR between the first virtual line L_V1 and the second virtual line L_V2 may be solubilized.

Figure 17:
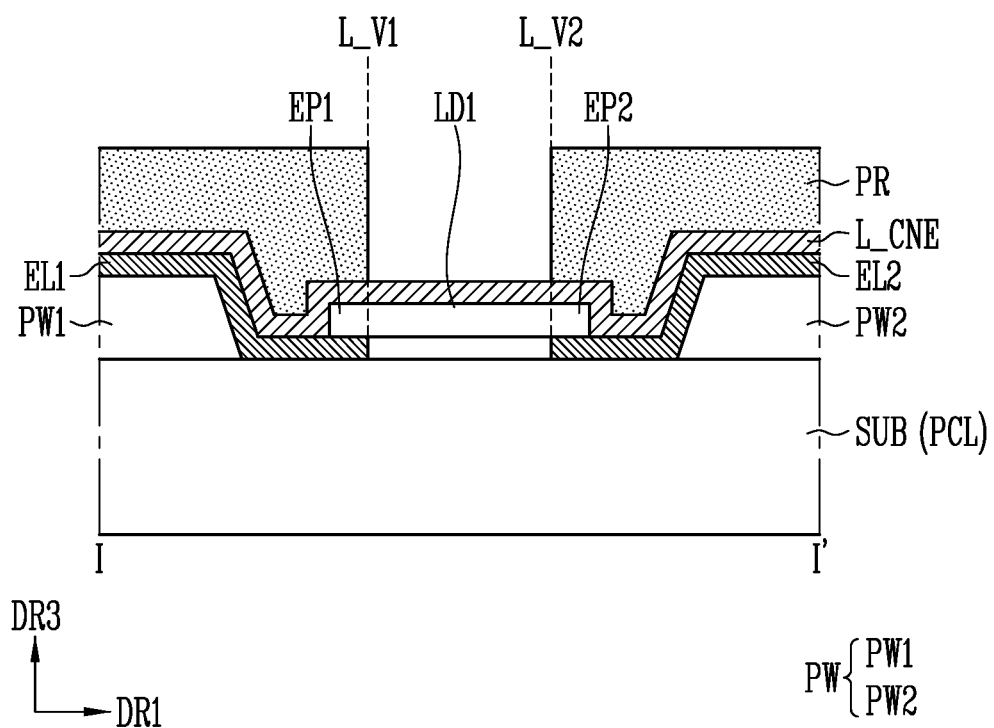

Subsequently, as shown in FIG. 17, a portion of the photoresist PR onto which the light is irradiated may be stripped through a development technique (or development process). For example, the photoresist PR between the first virtual line L_V1 and the second virtual line L_V2 may be stripped.

Figure 18:
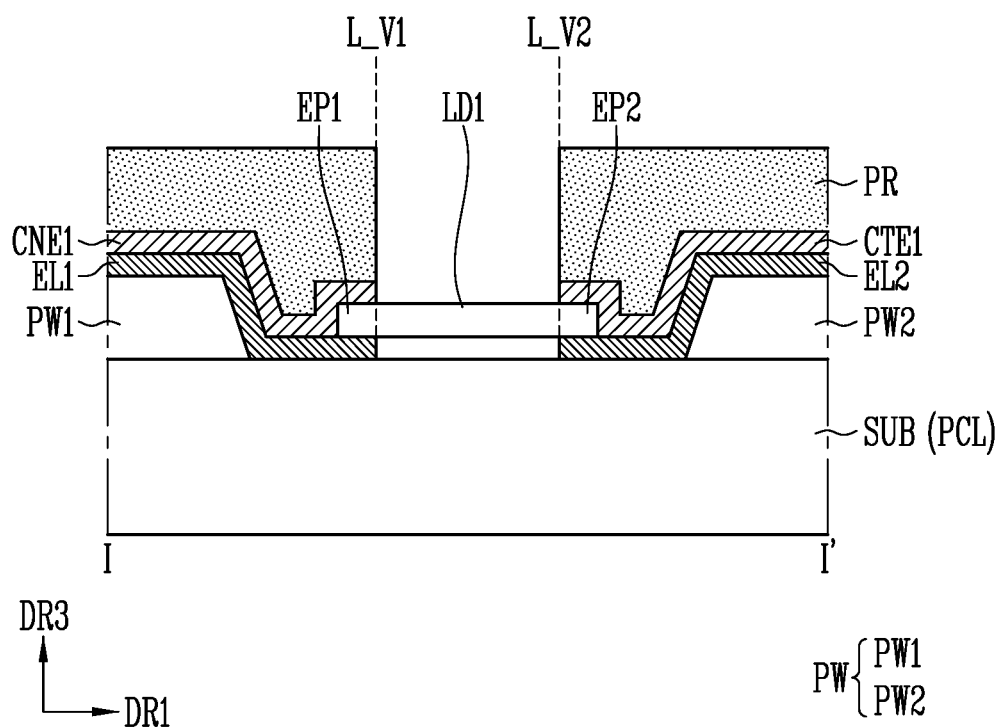

Subsequently, as shown in FIG. 18, a portion of the electrode layer L_CNE exposed by the photoresist PR between the first virtual line L_V1 and the second virtual line L_V2 may be removed through an etching technique (or etching process). Accordingly, a first contact electrode CNE1 and a first intermediate electrode CTE1 may be formed from the electrode layer L_CNE.

In an embodiment, in a case that an upper portion of the photoresist PR, which is spaced apart from the substrate SUB, is not solubilized as compared with a lower portion of the photoresist PR, which may be adjacent to the substrate SUB, the photoresist PR may be stripped to have a sectional shape substantially of a trapezoid between the first virtual line L_V1 and the second virtual line L_V2. As described with reference to FIG. 7, the first contact electrode CNE1 may further protrude toward the second electrode EL2 (or the first intermediate electrode CTE1) than the first electrode EL1, and the first intermediate electrode CTE1 may further protrude toward the first electrode EL1 (or the first contact electrode CNE1) than the second electrode EL2.

In an embodiment, the electrode layer L_CNE may be further etched outward of the first virtual line L_V1 and the second virtual line L_V2, in a process in which the electrode layer L_CNE may be etched by a thickness thereof between the first virtual line L_V1 and the second virtual line L_V2. As described with reference to FIG. 8, in a case that the first contact electrode CNE1 becomes more distant from the second electrode EL2 (or the first intermediate electrode CTE1) than the first electrode EL1, the first intermediate electrode CTE1 may become more distant from the first electrode EL1 (or the first contact electrode CNE1) than the second electrode EL2.

Figure 19:
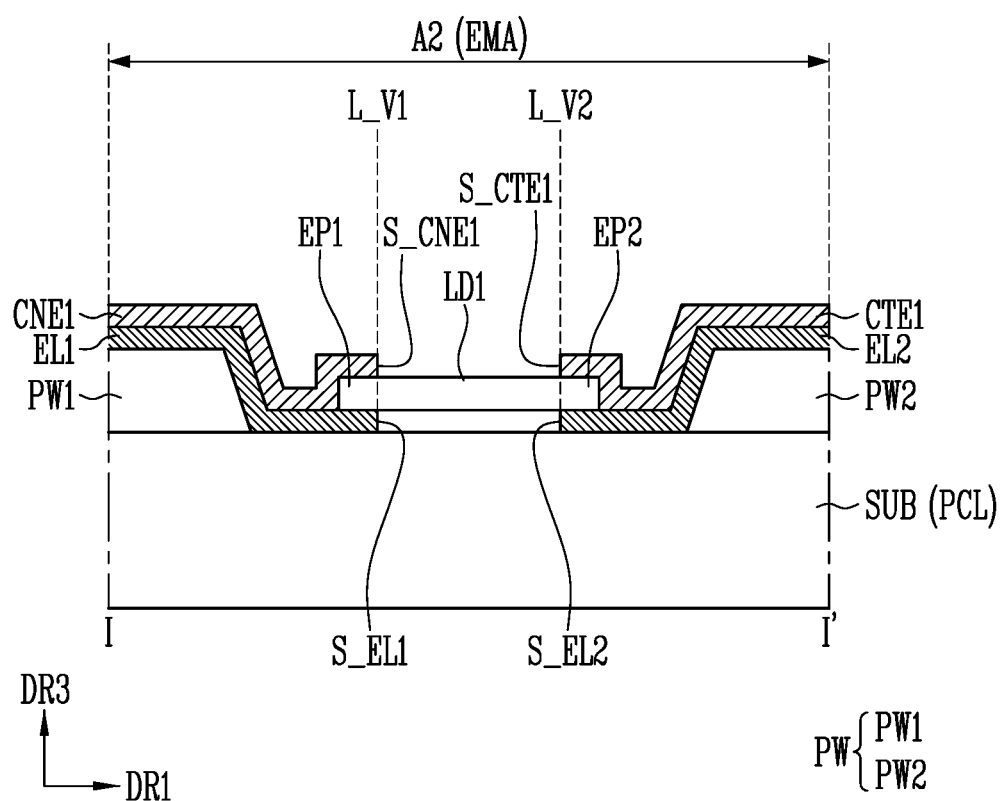

Subsequently, as shown in FIG. 19, the photoresist PR may be stripped. For example, the photoresist PR remaining in regions overlapping the first and second electrodes EL1 and EL2 may be stripped by using a separate photoresist stripping agent.

Subsequently, a passivation layer PASS1, a color filter, a color conversion layer, and the like may be formed to cover or overlap the first contact electrode CNE1 and the first intermediate electrode CTE1.

As described with reference to FIGS. 13 to 19, the first contact electrode CNE1 and the first intermediate electrode CTE1 may be formed through the back exposure using, as a mask, the first and second electrodes EL1 and EL2 (or first to fourth electrodes EL1 to EL4 shown in FIG. 5). Thus, it may be unnecessary to separately align the first contact electrode CNE1 and the first intermediate electrode CTE1 (or a mask for forming the same) with respect to the first and second electrodes EL1 and EL2. A separate mask may not be required so as to strip a portion of the photoresist PR on the first light emitting element LD1 (for example, a number of masks can be decreased since the first and second electrodes EL1 and EL2 may be used as a mask). Further, a high-resolution exposure device may not be required so as to accurately strip a portion of the photoresist PR on the first light emitting element LD1. For example, a fabricating process can be simplified, and fabrication cost can be reduced.

FIGS. 20 to 28 are schematic cross-sectional views illustrating a method of fabricating a display device in accordance with an embodiment. Views corresponding to FIG. 10 are illustrated in FIGS. 20 to 28. For convenience of description, based on a light emitting unit EMU (see FIG. 4) (or a display element layer DPL), a display device DD (see FIG. 3) (or a pixel PXL (see FIG. 5) is briefly illustrated in FIGS. 20 to 28.

First, referring to FIGS. 3, 5, 10, 13, and 20, a structure may be prepared, which may include first and second electrodes EL1 and EL2 formed on a substrate SUB and a first light emitting element LD1 aligned on the first and second electrodes EL1 and EL2.

Subsequently, an insulating layer L_INS may be formed, which covers or overlaps the first electrode EL1, the second electrode EL2, and the first light emitting element LD1. The insulating layer L_INS may be entirely coated or formed on the substrate SUB.

Figure 20:
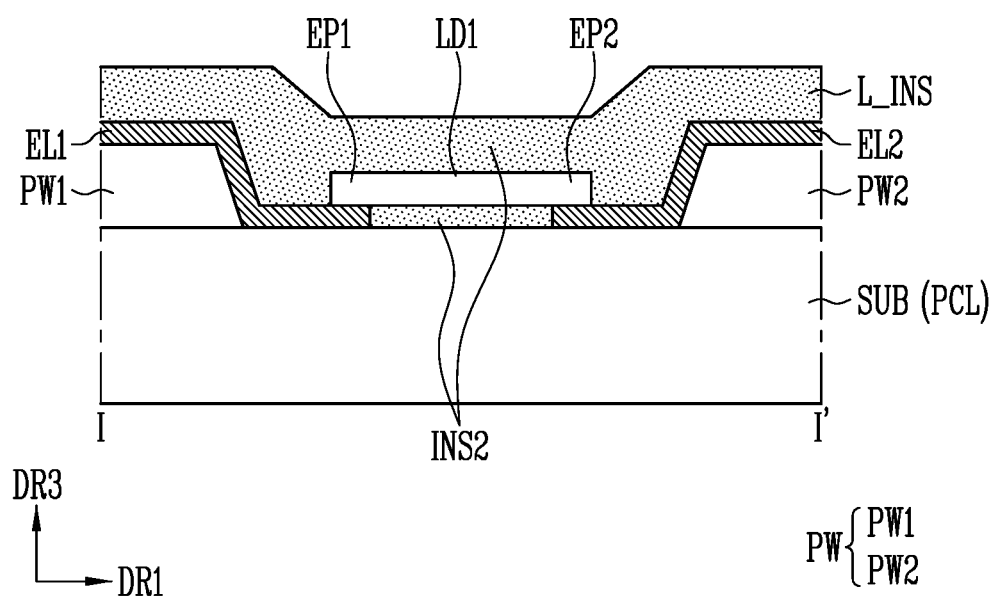
FIGS. 20 to 28 are schematic cross-sectional views illustrating a method of fabricating a display device in accordance with an embodiment.

The insulating layer L_INS may include an organic material. For example, the insulating layer L_INS may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin. Although a case where a top surface of the insulating layer L_INS, which overlaps the first light emitting element LD1, is lower (has a step difference) than that of the insulating layer L_INS, which overlaps the first and second electrodes EL1 and EL2, is illustrated in FIG. 20, this is merely illustrative, and the disclosure is not limited thereto. In a case that the insulating layer L_INS may include an organic material, the top surface of the insulating layer L_INS may be flat.

In an embodiment, the insulating layer L_INS may include a negative type photoresist composition.

Figure 21:
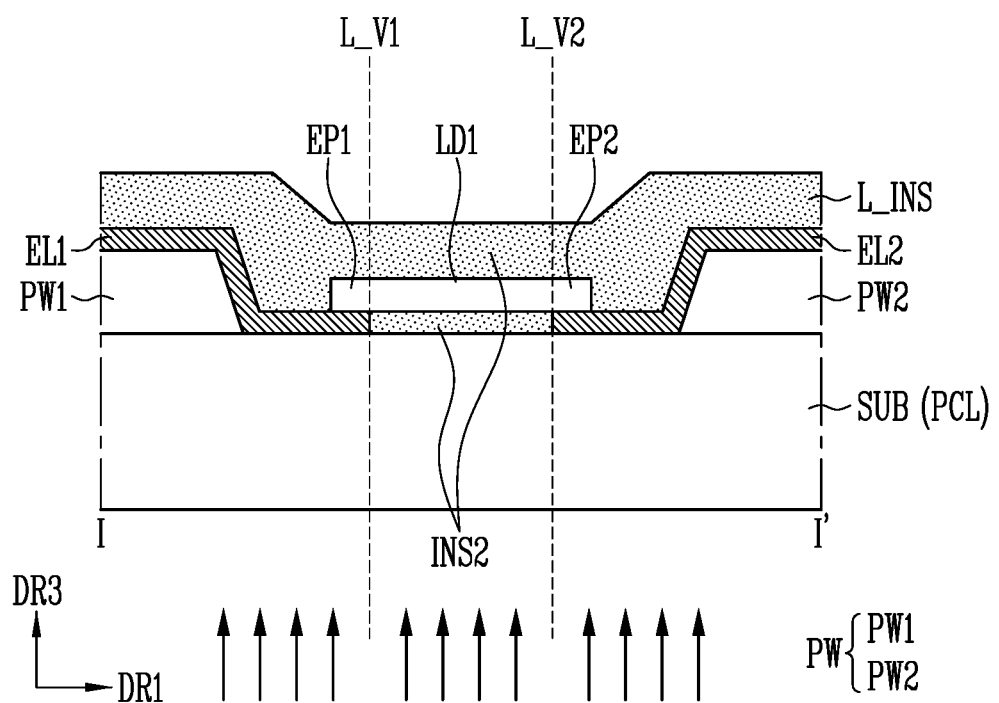

Subsequently, as shown in FIG. 21, light (for example, ultraviolet light) may be irradiated onto the substrate SUB (or the insulating layer L_INS) in the third direction DR3.

As described with reference to FIG. 6, since the first and second electrodes EL1 and EL2 include an opaque conductive material, light may be transmitted only between the first and second electrodes EL1 and EL2 and then irradiated onto the insulating layer L_INS. For example, back exposure may be performed on the substrate SUB (and the insulating layer L_INS) by using the first and second electrodes EL1 and EL2 as a mask.

Since the insulating layer L_INS may include a negative type photoresist composition, a portion of the insulating layer L_INS onto which the light is irradiated may be solubilized. For example, the insulating layer L_INS between a first virtual line L_V1 and a second virtual line L_V2 may be solubilized.

Figure 22:
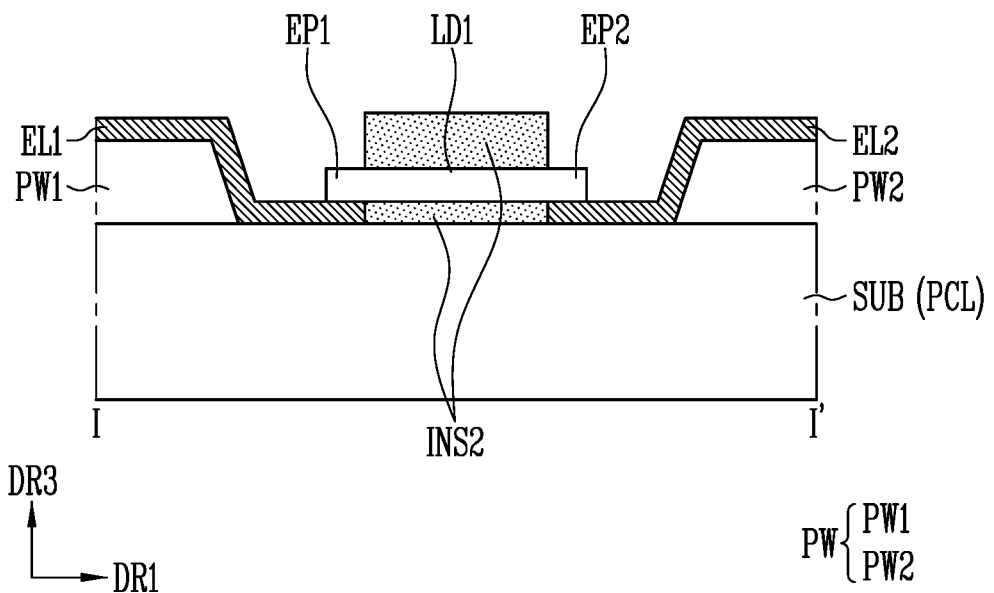

Subsequently, as shown in FIG. 22, the other portions except the portion of the insulating layer L_INS onto which the light is irradiated may be removed through a development technique (or development process). For example, the other portions of the insulating layer L_INS overlapping the first and second electrodes EL1 and EL2 in the third direction DR3 may be removed, and only the portion of the insulating layer L_INS onto which the light is irradiated may form a second insulating layer INS2 (or insulating pattern).

In an embodiment, an upper portion of the insulating layer L_INS, which is spaced apart from the substrate SUB, may not be solubilized as compared with a lower portion of the insulating layer L_INS, which may be adjacent to the substrate SUB. As described with reference to FIG. 11, the second insulating layer INS2 may be formed to have a sectional shape substantially of a trapezoid between the first virtual line L_V1 and the second virtual line L_V2.

Figure 23:
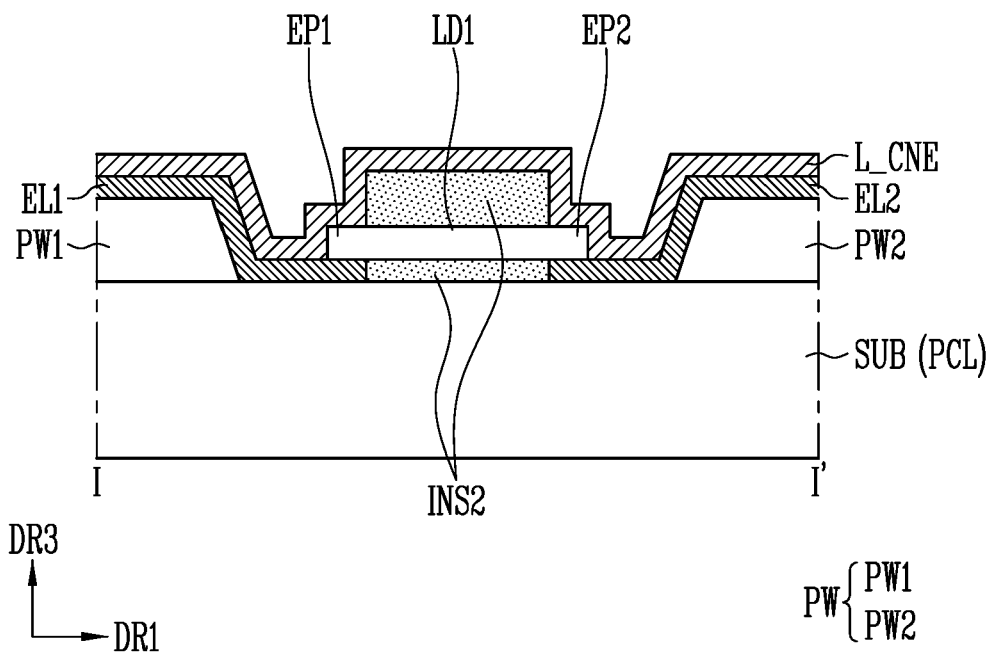

Subsequently, as shown in FIG. 23, an electrode layer L_CNE may be formed, which covers or overlaps the first electrode EL1, the second electrode EL2, the first light emitting element LD1, and the second insulating layer INS2. The electrode layer L_CNE may be entirely formed on the substrate SUB.

As described above, the electrode layer L_CNE may include a transparent conductive material (substance).

Figure 24:
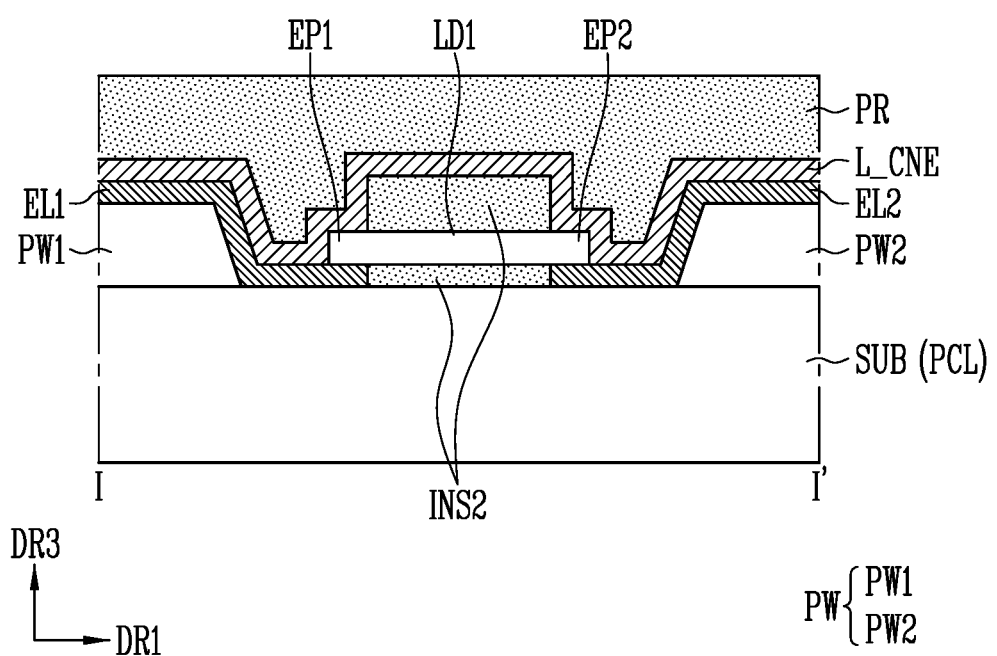

Subsequently, as shown in FIG. 24, a photoresist PR may be formed on the electrode layer L_CNE. As described above, the photoresist PR may include a positive type photoresist composition.

Figure 25:
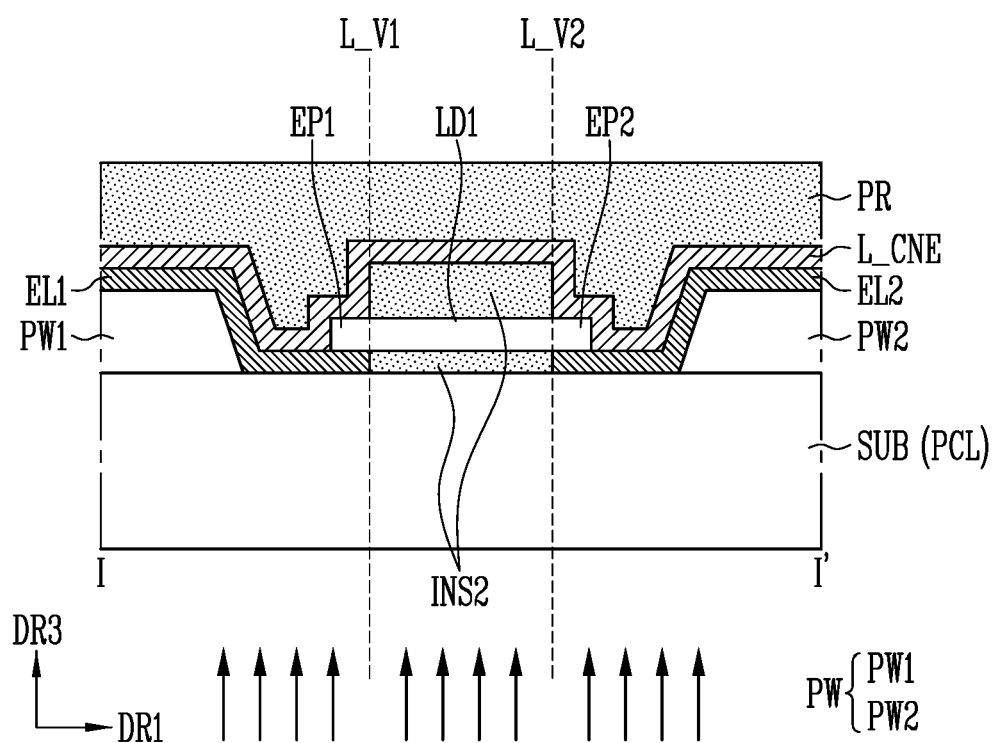

Subsequently, as shown in FIG. 25, light (for example, ultraviolet light) may be irradiated onto the substrate SUB in the third direction DR3.

As described with reference to FIG. 16, light may be transmitted only between the first and second electrodes EL1 and EL2 and then irradiated onto the photoresist PR. For example, back exposure may be performed on the substrate SUB (and the photoresist PR) by using the first and second electrodes EL1 and EL2 as a mask.

Figure 26:
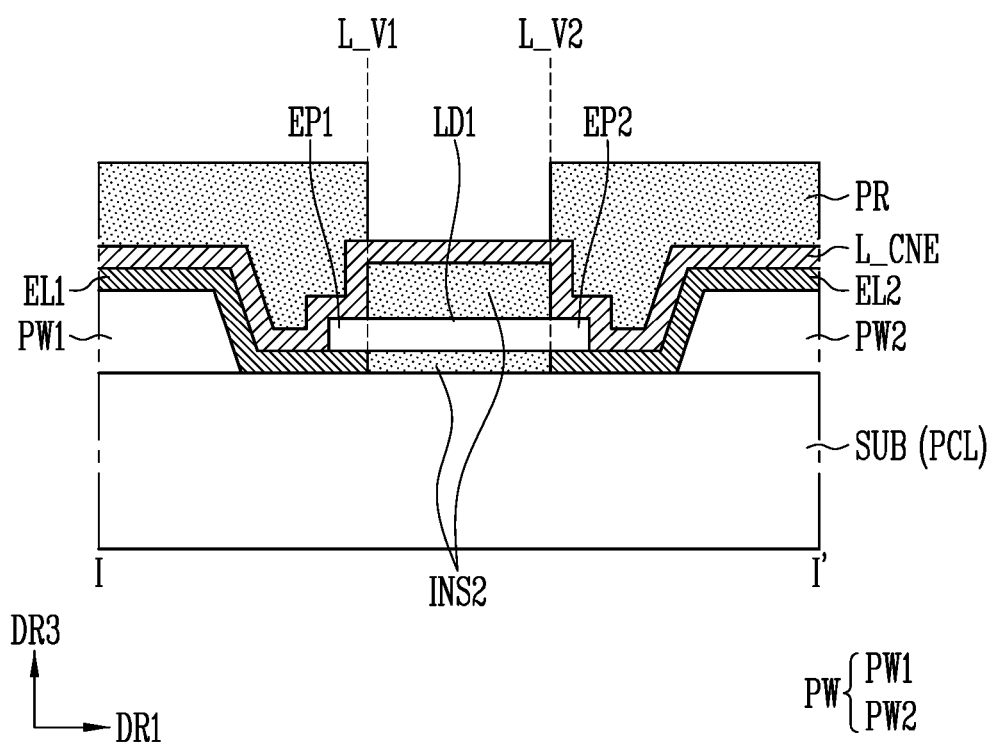

Subsequently, as shown in FIG. 26, a portion of the photoresist PR onto which the light is irradiated may be stripped through a development technique (or development process). For example, the photoresist PR between the first virtual line L_V1 and the second virtual line L_V2 may be stripped.

Figure 27:
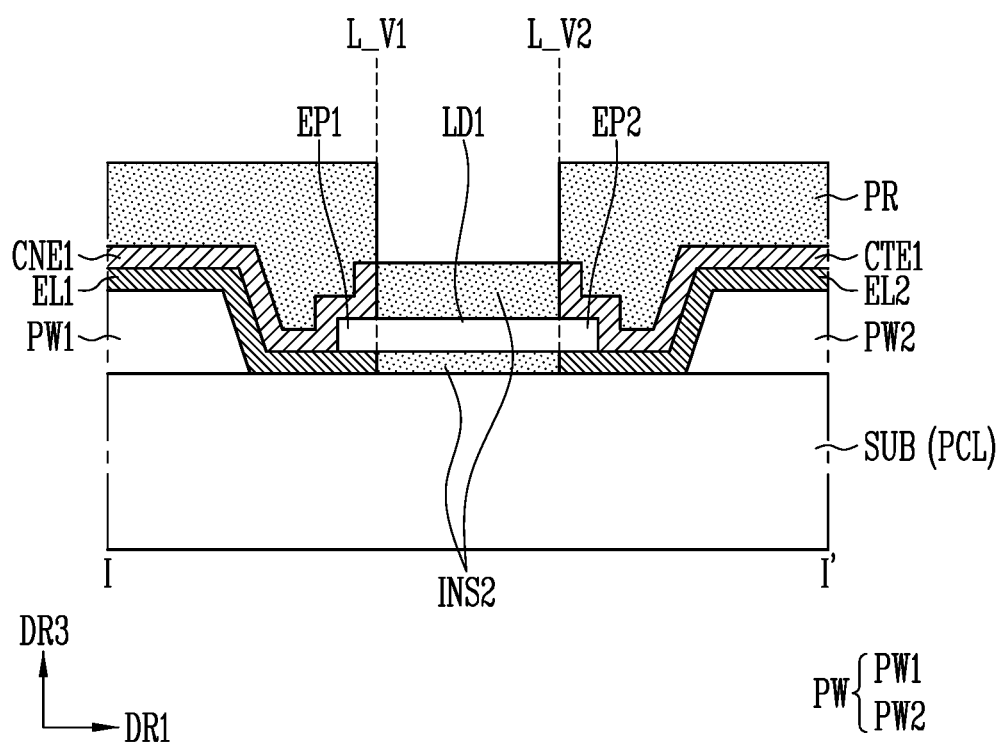

Subsequently, as shown in FIG. 27, a portion of the electrode L_CNE exposed by the photoresist PR between the first virtual line L_V1 and the second virtual line L_V2 may be removed through an etching technique (or etching process). For example, a first contact electrode CNE1 and a first intermediate electrode CTE1 may be formed.

Since the first contact electrode CNE1 and the first intermediate electrode CTE1 in addition to the second insulating layer INS2 may be formed by using the first and second electrodes EL1 and EL2 as a mask, end portions of the first and second electrodes EL1 and EL2, which face each other, side surfaces of the second insulating layer INS2, and end portions of the first contact electrode CNE1 and the first intermediate electrode CTE1, which face each other, may be located or disposed on the first and second virtual lines L_V1 and L_V2. The first and second electrodes EL1 and EL2, the side surfaces of the second insulating layer INS2, and the first contact electrode CNE1 and the first intermediate electrode CTE1 may be mutually aligned.

In an embodiment, in a case that a portion of the photoresist PR, which is spaced apart from the substrate SUB, is not solubilized as compared with a portion of the photoresist PR, which may be adjacent to the substrate SUB, the photoresist PR may be stripped to have a sectional shape substantially of a trapezoid between the first virtual line L_V1 and the second virtual line L_V2. As described with reference to FIG. 7, the first contact electrode CNE1 may further protrude toward the second electrode EL2 (or the first intermediate electrode CTE1) than the first electrode EL1, and the first intermediate electrode CTE1 may further protrude toward the first electrode EL1 (or the first contact electrode CNE1) than the second electrode EL2.

In an embodiment, the electrode layer L_CNE may be further etched outward of the first virtual line L_V1 and the second virtual line L_V2, in a process in which the electrode layer L_CNE may be etched by a thickness thereof between the first virtual line L_V1 and the second virtual line L_V2. The first contact electrode CNE1 may become more distant from the second electrode EL2 (or the first intermediate electrode CTE1) than the first electrode EL1, and the first intermediate electrode CTE1 may become more distant from the first electrode EL1 (or the first contact electrode CNE1) than the second electrode EL2.

Figure 28:
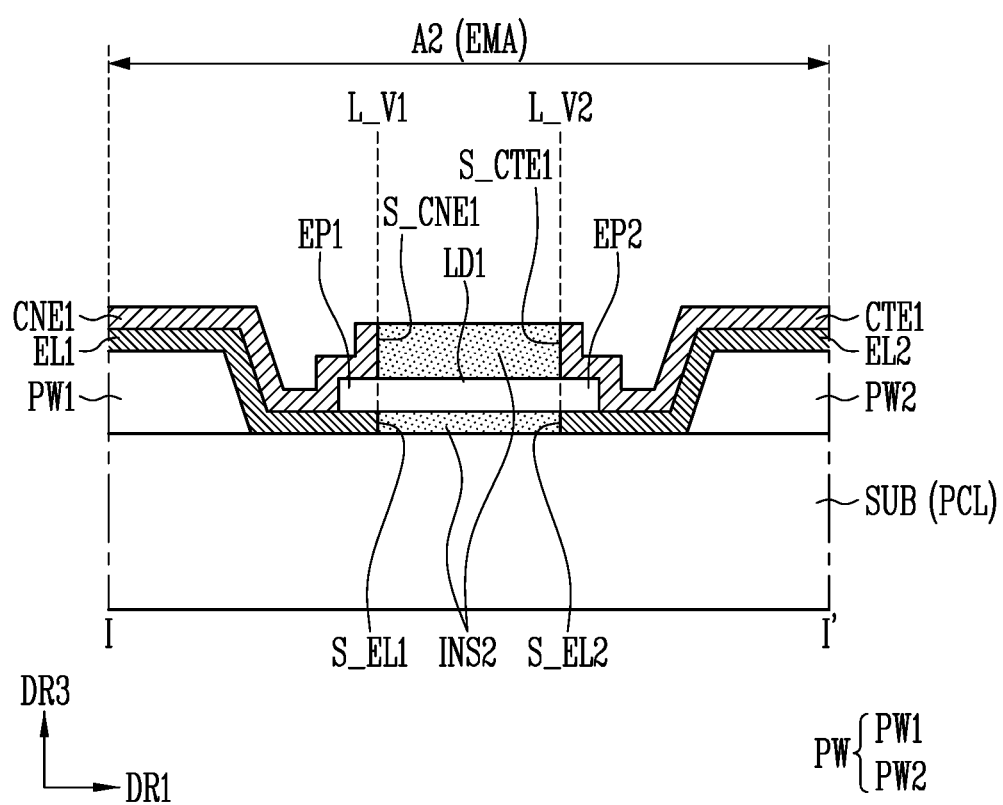

Subsequently, as shown in FIG. 28, the photoresist PR may be stripped. For example, the photoresist PR remaining in regions overlapping the first and second electrodes EL1 and EL2 may be stripped by using a separate photoresist stripping agent.

Subsequently, a passivation layer PASSI, a color filter, a color conversion layer, and the like may be formed to cover or overlap the first contact electrode CNE1 and the first intermediate electrode CTE1.

As described with reference to FIGS. 20 to 28, the second insulating layer INS2 in addition to the first contact electrode CNE1 and the first intermediate electrode CTE1 is further formed through the back exposure using, as a mask, the first and second electrodes EL1 and EL2 (or first to fourth electrodes EL1 to EL4 shown in FIG. 5). Thus, it is unnecessary to separately align the second insulating layer INS2 (or a mask for forming the same) with respect to the first and second electrodes EL1 and EL2 (or the first light emitting element LD1). A separate mask may not be required so as to form the second insulating layer INS2 exposing both end portions EP1 and EP2 of the first light emitting element LD1 (for example, a number of masks can be decreased since the first and second electrodes EL1 and EL2 may be used as a mask). Further, a high-resolution exposure device may not be required so as to accurately strip a portion of the photoresist PR with respect to the second insulating layer INS2. For example, a fabricating process can be simplified, and fabrication cost can be reduced.

In the display device and the method of fabricating the same in accordance with the disclosure, a third electrode and a fourth electrode (or a first contact electrode and a first intermediate electrode, which electrically connect first and second electrodes to a light emitting element) may be formed through back exposure using the first and second electrodes as a mask. Thus, it may be unnecessary to separately align the third and fourth electrodes (or a mask for forming the same) with respect to the first and second electrodes, and a separate mask and a high-resolution exposure device may not be required so as to form the third and fourth electrodes. For example, a fabricating process of the display device can be simplified, and fabrication cost can be reduced.

Also, in the display device and the method of fabricating the same in accordance with the disclosure, an insulating pattern (or a second insulating layer fixing an aligned light emitting element) may be further formed through the back exposure using the first and second electrodes as a mask. Thus, it may be unnecessary to separately align the insulating pattern (or a mask for forming the same) with respect to the first and second electrodes (or the light emitting element), and a separate mask may not be required so as to form the insulating pattern. Thus, a fabricating process of the display device can be further simplified, and fabrication cost can further be reduced.

Embodiments have been disclosed herein, and although terms are employed, they are used and are to be interpreted in a generic and descriptive sense only and not for purpose of limitation. In some instances, as would be apparent to one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a first alignment electrode and a second alignment electrode extending in a first direction and disposed on a substrate and spaced apart from each other in a second direction intersecting the first direction;
   a plurality of light emitting elements arranged between the first and second alignment electrodes, each light emitting element overlapping a furthest edge of the first alignment electrode and a furthest edge of the second alignment electrode in a thickness direction of the substrate;
   a first contact electrode disposed on the first alignment electrode, the first contact electrode electrically contacting an end portion of the light emitting element; and
   a second contact electrode disposed on the second alignment electrode, the second contact electrode electrically contacting another end portion of the light emitting element, the second contact electrode being spaced apart from the first contact electrode in the second direction, wherein
   a furthest edge of the first contact electrode and the furthest edge of the first alignment electrode are aligned to a first virtual line substantially perpendicular to the substrate, and
   a furthest edge of the second contact electrode facing the furthest edge of the first contact electrode and the furthest edge of the second alignment electrode are aligned to a second virtual line substantially perpendicular to the substrate.

2. The display device of claim 1, wherein
   a distance between the first contact electrode and the second contact electrode is equal to a distance between the first alignment electrode and the second alignment electrode,
   the furthest edge of the first contact electrode coincides with the furthest edge of the first alignment electrode in a plan view, and
   the furthest edge of the second contact electrode coincides with the furthest edge of the second alignment electrode in a plan view.

3. The display device of claim 1, wherein
   the first alignment electrode and the second alignment electrode include an opaque conductive material, and
   the first contact electrode and the second contact electrode include a transparent conductive material.

4. The display device of claim 3, wherein
   an opaque conductive material is not disposed between the first alignment electrode and the second alignment electrode in a plan view.

5. The display device of claim 1, further comprising a passivation layer disposed on the first contact electrode and the second contact electrode,
   wherein the passivation layer fills a gap between the first alignment electrode and the second alignment electrode, the gap being formed below each light emitting element.

6. The display device of claim 1, further comprising a first insulating layer disposed between the first alignment electrode and the second alignment electrode and the plurality of light emitting elements.

7. The display device of claim 1, wherein
   each light emitting element includes end portions having widths and a lateral surface having a length and extending to connect the end portions,
   the lateral surface of each light emitting element overlaps the furthest edge of the first alignment electrode and the furthest edge of the second alignment electrode in the thickness direction of the substrate, and
   the widths of the end portions of the light emitting element in the thickness direction of the substrate is less than the length of the lateral surface of the light emitting element in the second direction.

8. The display device of claim 1, further comprising an insulating pattern disposed on the plurality of light emitting elements between the first contact electrode and the second contact electrode.

9. The display device of claim 8, wherein
   a first side surface of the insulating pattern is disposed on the first virtual line, and
   a second side surface of the insulating pattern is disposed on the second virtual line.

10. The display device of claim 9, wherein
    the insulating pattern fills a gap between the first alignment electrode and the second alignment electrode, and
    the gap is formed below each light emitting element.

11. The display device of claim 9, wherein
    the first contact electrode contacts the first side surface of the insulating pattern, and
    the second contact electrode contacts the second side surface of the insulating pattern, and
    the first contact electrode and the second contact electrode do not contact a top surface of the insulating pattern.

12. The display device of claim 11, wherein
    the first contact electrode overlaps the first side surface of the insulating pattern, and
    the second contact electrode overlaps the second side surface of the insulating pattern.

13. The display device of claim 9, wherein
    a section of the insulating pattern along the second direction has a substantially trapezoidal shape, and
    an area of a bottom surface of the insulating pattern is greater than an area of a top surface of the insulating pattern.

14. The display device of claim 9, wherein
a section of the insulating pattern along the second direction has a reversed tapered shape, and
an area of a bottom surface of the insulating pattern is less than an area of a top surface of the insulating pattern.

15. The display device of claim 1, wherein
each of the plurality of light emitting elements includes a lower surface facing the substrate and an upper surface opposite to the lower surface, and
at least a portion of each of the first alignment electrode and the second alignment electrode is directly adjacent to the lower surface, and is not directly adjacent to the upper surface.

16. The display device of claim 1, wherein the first alignment electrode and the second alignment electrode do not cover side surfaces of each of the plurality of light emitting elements.

* * * * *